United States Patent [19]
Mazuré et al.

[11] Patent Number: 5,398,200
[45] Date of Patent: Mar. 14, 1995

[54] VERTICALLY FORMED SEMICONDUCTOR RANDOM ACCESS MEMORY DEVICE

[75] Inventors: Carlos A. Mazuré; Jon T. Fitch; James D. Hayden; Keith E. Witek, all of Austin, Tex.

[73] Assignee: Motorola, Inc., Schamburg, Ill.

[21] Appl. No.: 183,086

[22] Filed: Jan. 18, 1994

Related U.S. Application Data

[60] Division of Ser. No. 966,643, Nov. 26, 1992, which is a continuation-in-part of Ser. No. 844,044, Mar. 2, 1992, Pat. No. 5,286,674.

[51] Int. Cl.⁶ .................. H01L 29/78; H01L 27/01
[52] U.S. Cl. .................. 365/174; 257/296; 257/302; 257/304; 257/311; 437/52
[58] Field of Search .................. 365/174; 437/225; 257/908, 302, 301, 304, 311, 296

[56] References Cited

U.S. PATENT DOCUMENTS

| | | | |
|---|---|---|---|
| 4,489,478 | 12/1984 | Sakurai | 29/574 |
| 4,530,149 | 7/1985 | Jastrzebski et al. | 29/571 |
| 4,554,570 | 11/1985 | Jastrzebski et al. | 357/23.4 |
| 4,810,906 | 3/1989 | Shah et al. | 307/448 |
| 4,910,564 | 3/1990 | Inoue | 357/23.4 |
| 4,974,060 | 11/1990 | Ogasawara | 357/23.6 |
| 4,992,838 | 2/1991 | Mori | 357/23.4 |
| 5,010,386 | 4/1991 | Groover, III | 357/42 |
| 5,017,504 | 5/1991 | Nishimura et al. | 437/40 |
| 5,057,896 | 10/1991 | Gotou | 357/49 |
| 5,072,276 | 12/1991 | Malhi et al. | 357/42 |
| 5,082,795 | 1/1992 | Temple | 437/41 |
| 5,122,846 | 6/1992 | Haken | 357/23.4 |
| 5,122,848 | 6/1992 | Lee et al. | 357/23.6 |
| 5,218,218 | 6/1993 | Akazawa | 257/302 |
| 5,281,837 | 1/1994 | Kohyama | 257/296 |
| 5,308,782 | 5/1994 | Mazuré et al. | 437/52 |

OTHER PUBLICATIONS

"Impact of Surrounding Gate Transistor (SGT) for Ultra-High-Density LSI's", by Hiroshi Takato et al., was published in IEEE Trans. on Electron Devices, vol. 38, No. 3, Mar. 1991, pp. 573–577.

*Primary Examiner*—Viet Q. Nguyen
*Attorney, Agent, or Firm*—Keith E. Witek

[57] ABSTRACT

A semiconductor memory device is formed having a substrate (12). A diffusion (14) is formed within the substrate (12). A first vertical transistor stack (122) is formed. A second vertical transistor stack (124) is formed. The first vertical transistor stack (122) has a transistor (100) underlying a transistor (104). The second vertical transistor stack (124) has a transistor (102) underlying a transistor (106). The transistors (100 and 104) are connected in series, and the transistors (102 and 106) are connected in series. In a preferred form, transistors (100 and 102) are electrically connected as latch transistors for a semiconductor memory device and transistors (106 and 104) are connected as pass transistors. Two vertical stacks (126 and 128) form electrical interconnections (118 and 120) and resistive devices (134 and 138) for the semiconductor memory device.

31 Claims, 19 Drawing Sheets

VERTICALLY FORMED SEMICONDUCTOR RANDOM ACCESS MEMORY DEVICE

This is a divisional of application Ser. No. 07/966,643, filed Nov. 26, 1992, which is a continuation-in-part of application Ser. No. 07/844,044, filed Mar. 2, 1992, now U.S. Pat. No. 5,286,674.

FIELD OF THE INVENTION

The present invention relates generally to semiconductor device and process technology, and more particularly, to semiconductor memories.

BACKGROUND OF THE INVENTION

Planar transistors are often used to fabricate integrated circuit memory devices such as static random access memories (SRAM). A planar transistor has a diffused source electrode and drain electrode separated by a channel region. Overlying the channel region is a gate electrode that is separated from the channel region by a gate oxide. Planar transistors, although used and useful in many integrated circuit memory applications, are area intensive and consume a large amount of substrate area per transistor. In addition, with integrated circuit geometries decreasing into sub-micron ranges, planar transistors have various disadvantages. At smaller geometries and thinner gate oxide thicknesses, well documented problems such as hot carrier injection, leakage currents, isolation, short channel behavior, and channel length variations are major problems in planar transistors.

To overcome some of the disadvantages described above for planar transistors, thin film transistors (TFTs), elevated source and drain transistors, lightly doped drain (LDD) transistors, and other improvements were developed. Although the improvements reduced some of the disadvantages listed above, the improvements had some undesirable characteristics. The primary undesirable characteristic is the fact that the improved transistors were, in most cases, as area intensive or more area intensive than the planar transistor or, in the case of the TFT, did not perform as well as planar transistors. For example, small memory cell areas can result via the use of TFTs, but TFTs are highly resistive and therefore not adequate for all applications.

Various approaches have been used to try to reduce circuit surface area and increase transistor packing density while at the same time reducing some of the adverse effects described above. The surrounding gate transistor (SGT) was developed wherein a spacer gate and planar diffusions are used to form a transistor. The SGT reduced some of the disadvantages that affect planar transistors and reduced surface area due to a vertically positioned spacer gate. Topography problems and the geometry of the SGT usually result in source, gate, and drain contacts that are difficult to achieve and are difficult to consistently produce using submicron technology. In addition, doping of source regions, drain regions, and channel regions via implants can be difficult due to geometry and may require special processing.

Conventional planar transistors and TFF technology are not currently progressing at a rate which will allow for the formation of large memory cells, such as 64 Mbit SRAMs or 256 Mbit SRAMs.

SUMMARY OF THE INVENTION

The previously mentioned disadvantages are overcome and other advantages achieved with the present invention. The present invention comprises a memory device. The memory device has a substrate which has a surface. A first vertical structure is formed at least partially overlying the surface of the substrate. The first vertical structure has a first vertical transistor Underlying a second semiconductor device. A second vertical structure is formed at least partially overlying the surface of the substrate and laterally adjacent the first vertical structure. The second vertical structure has a second vertical transistor underlying a second semiconductor device. Electrical interconnects are coupled to the first and second vertical transistors and the first and second semiconductor devices to form said memory device.

The present invention will be more clearly understood from the detailed description below in conjunction with the accompanying drawings.

DESCRIPTION OF THE PREFERRED EMBODIMENT

Figure 1:
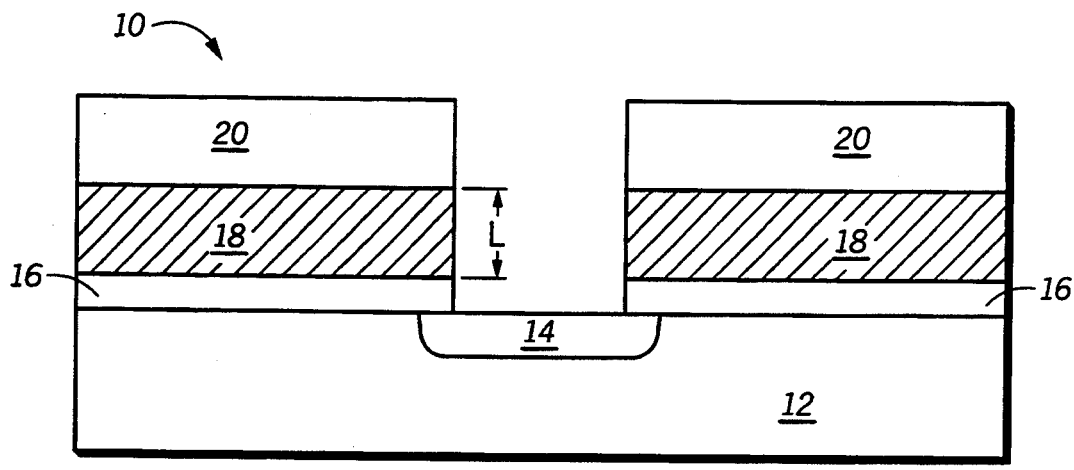
FIGS. 1-4 illustrate, in cross-sectional form, a transistor for use in a semiconductor memory device and method of formation in accordance with the present invention.

Illustrated in FIG. 1 is a structure suitable for formation of a transistor 10. The transistor 10 has a base layer which is a substrate 12 having a surface and having a first conductivity type. If transistor 10 represents a first transistor formed overlying a second transistor (not illustrated), the base layer for the first transistor is a conductive top layer or top electrode of the underlying second transistor. Substrate 12 may be made of silicon, gallium arsenide, silicon on sapphire, epitaxial formations, germanium, germanium silicon, polysilicon, diamond, silicon on insulator (SOI), and/or like substrate materials. Preferably, the substrate 12 is made of silicon. A diffusion 14 is formed within the substrate 12. Various methods may be used to form diffusion 14. These methods are discussed below. A first dielectric layer 16 is formed overlying the substrate 12 and initially overlying the diffusion 14. A control electrode conductive layer 18 is formed overlying the dielectric layer 16. In a preferred form, conductive layer 18 is polysilicon, but conductive layer 18 may be a metal, a salicide or silicide, germanium silicon, a polycide, or the like. A second dielectric layer 20 is formed overlying the conductive layer 18.

The dielectric layers 16 and 20, and all other dielectrics described herein may vary in physical and chemical composition based upon the function they perform. The dielectric layers described herein may be wet or dry silicon dioxide ($SiO_2$), nitride, silicon nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride ($P-SiN_x$), titanium oxide, and/or the like. Specific dielectrics are noted where a specific dielectric is preferred or required.

In FIG. 1, a masking layer of photoresist (not illustrated) is deposited overlying the dielectric layer 20. The masking layer (not illustrated) is conventionally patterned and etched to form a mask opening that exposes a portion of the dielectric layer 20. A portion of the dielectric layer 20 is etched selective to the conductive layer 18 to form an opening in the dielectric layer 20. A portion of the conductive layer 18 is etched selective to the dielectric layer 16 to deepen the opening by etching into the conductive layer 18. A portion of the dielectric layer 16 is etched selective to the substrate 12 to further deepen the opening by etching into the dielectric layer 16. The etching of the dielectric layer 16 exposes diffusion 14. The etching of the dielectric layers 16 and 20 and control electrode conductive layer 18 results in an opening that is self-aligned to the mask opening. The opening is referred to as a "device opening" in some cases. In another form, non-selective etch processing may be used to form the device opening.

The diffusion 14, in FIG. 1, is formed in one of at least two ways. In one form, diffusion 14 can be implanted or diffused into the substrate selectively through the use of one of a photoresist mask, an oxide mask, a nitride mask or the like. Diffusion 14, in a similar manner, can be implanted through an oxide or like material to ensure a shallow, dopant-dispersed junction. This implantation or diffusion occurs before the formation of the conductive layer 18. In a second method, the diffusion 14 can be implanted or diffused after the formation of the device opening. The second method, when using implantation, is preferred due to the fact that the resulting diffusion 14 is self-aligned to the device opening or mask opening. The diffusion 14 may be either N-type or P-type and may contain a plurality of dopant atoms (e.g. phosphorus and arsenic). The device opening may be of any geometry or size but is preferably a circular contact or a rectangular contact of minimum lithographic size (on the order of 0.5 micron or less).

Figure 2:
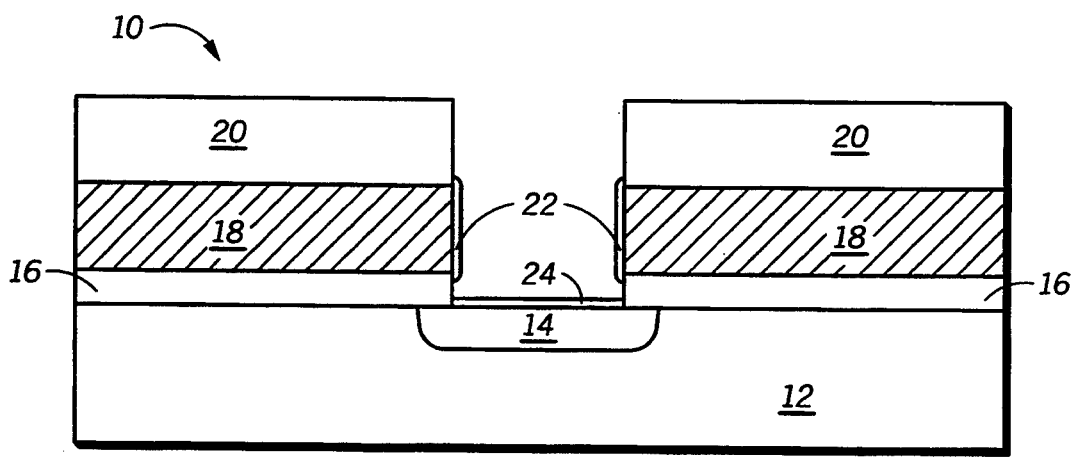

FIG. 2 illustrates a sidewall dielectric layer 22 formation step. A sidewall dielectric layer 22 is formed on a sidewall of the conductive layer 18 that results from the formation of the opening. Due to the fact that the dielectric functions as a gate oxide, the dielectric layer 22 is in most cases a grown $SiO_2$ layer. The growth of dielectric layer 22 will result in a thin dielectric layer 24 being grown on the exposed surface of the diffusion 14.

Figure 3:
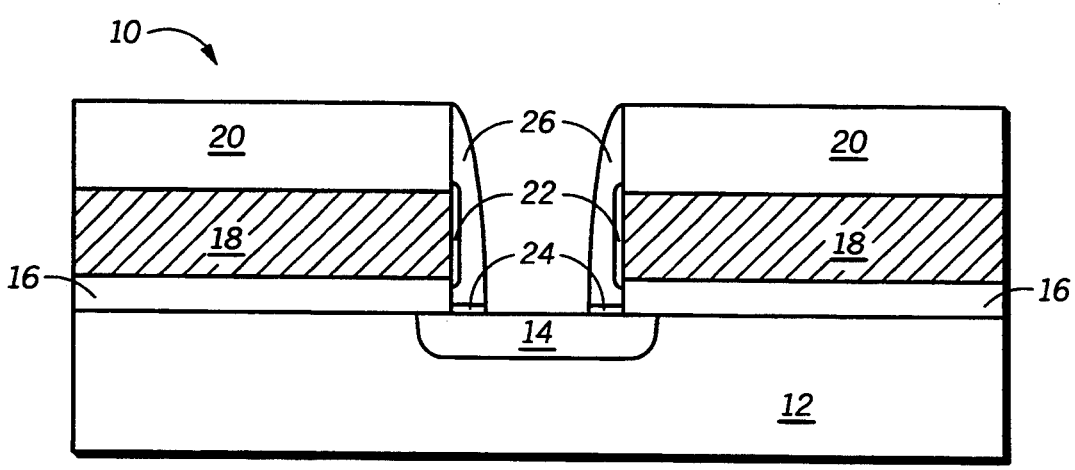

The formation of the dielectric layer 24 is a side-effect that is undesirable. Therefore, FIG. 3 illustrates a dielectric removal step for a portion of the dielectric layer 24. A cylindrical dielectric spacer 26 or like formation is formed overlying the dielectric layer 24 and adjacent the dielectric layer 22. Preferably the spacer 26 is nitride or an oxide which can be etched selective to $SiO_2$, cylindrical in geometry, and formed within and adjacent a sidewall of the device opening. The spacer 26 forms an inner opening within the device opening. The spacer 26 is used to protect the dielectric layer 22 from subsequent oxide etching. An oxide etch is then performed selective to spacer 26 and substrate 12. The oxide etch removes a portion of dielectric layer 24 that lies within the cylindrical dielectric spacer 26. A portion of the dielectric layer 24 which underlies the spacer and surrounds a periphery of the opening remains unetched. The spacer 26 is then removed via conventional nitride or removable spacer techniques.

Figure 4:
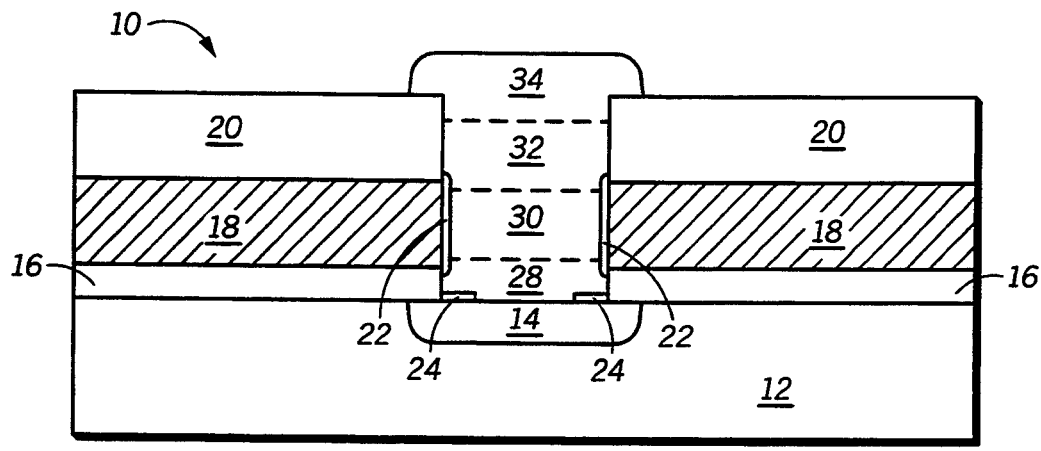

In FIG. 4, first and second current electrodes, also respectively referred to as a drain and a source, and a channel region are formed. In a preferred form, a grown conductive region is used to form the first and second current electrodes and the channel region. Preferably, the grown conductive region is formed via epitaxial growth of the base layer of material.

The transistor 10 is placed into a piece of equipment suitable for epitaxial growth. Growth is initiated by heating transistor 10 and subjecting exposed portions of the diffusion 14 or the substrate 12 to a chemical compound such as dichloro-silane or a similar silicon source gas.

Initially, a first current electrode or drain electrode 28 is formed in the device opening. Electrode 28 is formed of a second conductivity type that is opposite the first conductivity type. In order to dope the drain electrode 28 with dopant atoms of a second conductivity type, in-situ doping is preferred although ion implantation is possible. In-situ doping means that the drain electrode 28 is doped during growth by a dopant gas source. If the second conductivity type is P-type, then a boron-containing gas or a like dopant gas is used to dope drain electrode 28. If the second conductivity type is N-type, then a phosphorus-containing, arsenic-containing, or like dopant gas is used to dope electrode 28. Drain electrode 28 is grown adjacent the first dielectric layer 16, with in-situ doping, until the drain electrode 28 is adjacent or nearly adjacent a bottom portion of the sidewall dielectric 22 as illustrated in FIG. 4. Lightly doped drain (LDD) regions or graded doping profiles may be formed by altering the in-situ doping concentration.

Epitaxial growth continues in a similar manner to form a channel region 30. The channel region 30 is formed of the first conductivity type, preferably via in-situ doping as described herein. Due to the fact that dielectric layer 22 is a gate oxide and that conductive layer 18 functions as a gate, the doping in the channel region 30 can be used to adjust threshold voltages. The channel region is grown, with in-situ doping, until the electrode is adjacent or nearly adjacent a top portion of the sidewall dielectric 22 as illustrated in FIG. 4.

Epitaxial growth continues in a similar manner to form a second current electrode, also referred to as a source electrode, of a second conductivity type. The second current electrode has two sub-regions. The two sub-regions are a lightly doped electrode 32 and a heavily doped electrode 34. The electrodes 32 and 34 are formed by changing the in-situ doping concentration during growth. Initially, the second conductivity doping gas is at a predetermined concentration. After a predetermined time, and therefore after a predetermined epitaxial growth thickness, the lightly doped electrode 32 is formed and the dopant concentration is increased to a second predetermined level. While maintaining the second predetermined level, epitaxial growth continues to form the heavily doped electrode 34.

It is advantageous to have a transistor with a half lightly doped drain (LDD) structure as illustrated in FIG. 4. In general, LDD regions result in an increase in series resistance. If the LDD region can be formed only at a source electrode, where the LDD region is most needed, the advantages of the LDD configuration are preserved while reducing series resistance. It should be noted that a source and a drain region can be interchangeable in the structure of FIG. 4. If the source and drain functionality is switched (i.e. the source is formed underlying the channel region 30 and the drain is formed overlying the channel region 30), an LDD structure may be formed for the lower electrode 28. It should also be apparent that a full LDD transistor can be formed by forming LDD regions for both the source and the drain. It is important to note that LDD regions are optional and that the doping for both the source and the drain regions can be a constant.

It is also important to note that epitaxial growth requires a clean surface, therefore before initiating growth a cleaning cycle, such as a conventional RCA oxidizing clean, an Ishizaka-Shiraki clean, or an equivalent cleaning cycle, is performed. In addition, a thin film transistor (TFT) can be formed by the epitaxial approach described above. If the substrate 12 is polysilicon instead of single crystalline silicon, then polysilicon electrode regions and channel regions are epitaxially grown. This growth forms a vertical TFT that will be similar in structure to the transistor 10 of FIG. 4. A vertical TFT can be helpful in terms of saving area in memory cell designs.

Figure 5:
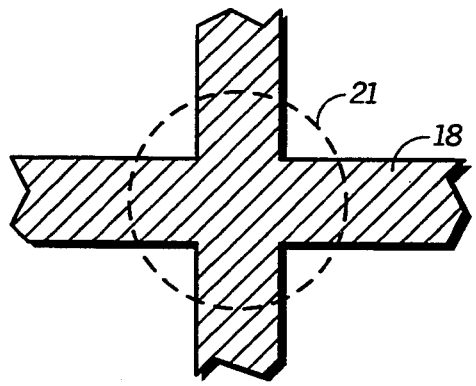
FIG. 5 illustrates, in a top perspective form, a vertical transistor having a plurality of gates for use in a semiconductor memory device in accordance with the present invention.

It is important to note that the formation of the opening in FIG. 1 can be used to form a multi-gated transistor having a plurality of gate electrodes. The plurality of gate electrodes or N gates, where N is an integer, is formed in one of two ways. A first method involves forming a gate conductive layer, lithographically masking the gate conductive layer, and etching to form N physically separate and distinct gates. In this method, photolithographic alignment to the device opening is critical and therefore this method is not preferred. A preferred method would be to form a gate conductive layer as a single region or layer and use the formation of the device opening to separate the single gate conductive layer into N conductive gate regions. This method assures that all of the gates are self-aligned to the device opening. FIG. 5 illustrates, in one form, a top perspective view of the gate conductive layer 18 and a device opening 21 that is used to etch the layer 18 into N self-aligned gates, where N is four in the illustrated example.

Figure 6:
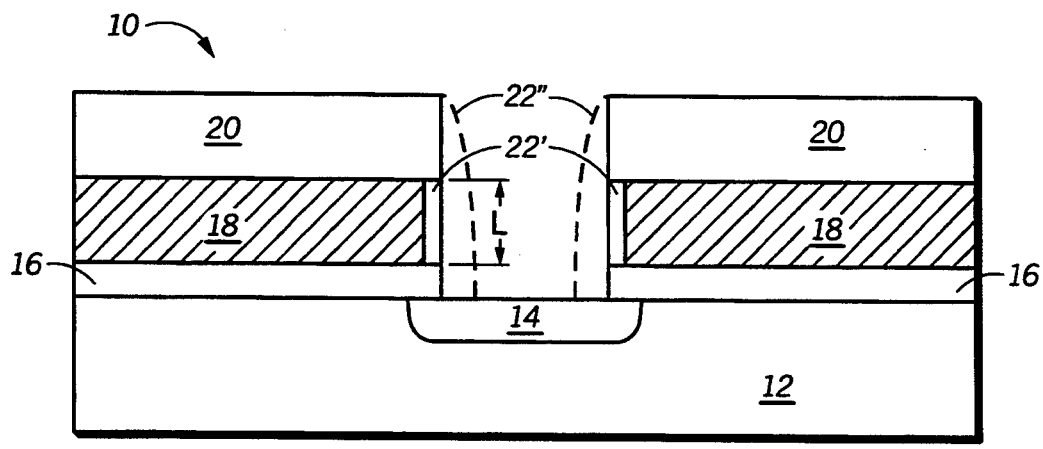
FIG. 6 illustrates, in cross-sectional form, an alternative method of sidewall dielectric formation for a transistor for use in a semiconductor memory device in accordance with the present invention.

In FIG. 4, the dielectric layer 24 that remains around a periphery of the device opening reduces epitaxial seeding area for subsequent epitaxial growth. Therefore, FIG. 6 illustrates an alternative method that may be used to replace the steps of FIGS. 2-3 and achieve a greater epitaxial seeding area. When etching the dielectric layers 16 and 20 and the conductive layer 18 to form the opening, a dielectric layer 20 etch followed by a conductive layer 18 etch, followed by a dielectric layer 16 etch is usually used to expose the substrate 12 and self-align various features of transistor 10. If during the conductive layer 18 etch an over-etch or isotropic etch is performed, the conductive layer 18 will laterally etch and recess into a "cave" having sides defined by the dielectric layers 16 and 20. With a conductive layer 18 that is recessed from a sidewall of the opening, a dielectric layer 22' can be formed as illustrated in FIG. 6. The formation of the dielectric layer 22' forms a surface dielectric layer (not illustrated) overlying the diffusion 14 which may be removed. The difference is that a spacer is no longer needed. A reactive ion etch (RIE) can be performed to completely remove the surface dielectric layer from the surface of the diffusion 14 without affecting the recessed dielectric layer 22'.

If the dielectric layer 22' is formed such that a portion of the "cave" still remains, an optional dielectric spacer 22" may be formed laterally adjacent the opening and laterally adjacent the conductive layer 18 as illustrated in FIG. 6. The optional dielectric spacer 22" is preferably formed of a TOES-based oxide. The spacer is then RIE etched to form the dielectric layer 22' as a composite dielectric having a polysilicon grown SiO$_2$ layer adjacent the conductive layer 18 and a TOES-based oxide layer adjacent the polysilicon grown SiO$_2$ layer. This composite oxide formation is used to misalign micropores (i.e. defects) within dielectric layer 22' to create an improved gate dielectric layer.

In addition, during RIE etching, plasma damage can result in the dielectric layer 22'. Due to the fact that the dielectric layer 22' functions as a gate oxide, dielectric layer 22' must be of excellent quality. Therefore, to avoid or reduce plasma damage during RIE etching, the dielectric layer 22' is usually nitrided via N$_2$, N$_2$O, NH$_3$, or an equivalent. A nitrided oxide material resists plasma damage more than other oxide materials. A nitrided oxide is advantageous but optional for transistor 10.

Both N-channel and P-channel transistors can be formed. If the first conductivity is N-type and the second conductivity is P-type, then a P-channel vertical transistor is formed. If the first conductivity is P-type and the second conductivity is N-type then an N-channel vertical transistor is formed.

In most cases, the transistor 10 of FIG. 1 will have a conductive layer 18 that completely surrounds the channel region 30. A completely surrounding conductive layer 18 allows for maximum current carrying capability, a more consistent aspect ratio (transistor width/transistor length ratio), and reliable photolithographic alignment. In other cases, an increased packing density can be achieved by partially surrounding the channel region 30 with conductive layer 18. This increased packing density is achieved by avoiding spacing requirements between conductors for most polysilicon and metal design rules.

The transistor 10 may be used to form vertically stacked vertical transistors. These vertically stacked vertical transistors may then be used to form compact static random access memory (SRAM) cells. All of the transistors which are used to manufacture the compact SRAM cells may have all of the flexibility described above for transistor 10 with respect to sidewall dielectric formation, LDD regions, doping profiles, diffusions, oxides, and the like. Other vertical transistors exist and may be used in the embodiments presented herein.

Transistor 10 may be vertically stacked on top of another transistor 10 to implement memory cells having surface area of approximately one square micron. For example, if a lithographic feature size of 0.25 micron is used and a minimum spacing requirement between features is on the order of 0.25 micron, then a one square micron cell can be achieved. If a feature size of 0.4 micron is used and a minimum spacing requirement between features is on the order of 0.4 micron, then roughly a 2.5 square micron cell can be achieved. The contact opening or device opening is usually sub-micron in size. If a feature size of 0.5 micron is used and a minimum spacing requirement between features is on the order of 0.5 micron, then roughly a four square micron cell can be achieved. FIGS. 7-14 a plurality of M vertical transistors, wherein M is an integer equal to two, is stacked overlying each other. Each of the stacked transistors is independently either N-channel or P-channel devices. P-channel means that a transistor has P-type doped source and drain regions. N-channel means that a transistor has N-type doped source and drain regions. Each of the stacked transistors has from one to N conductive gates and N may differ in value between each of the M stacked transistors.

In a stack of M transistors, the second current electrode, or top electrode, of a bottom transistor is connected to a first current electrode, or bottom electrode, of an overlying transistor. Due to this connection scheme, a P-type region will be in contact with an N-type region in some cases and create a PN junction. To avoid diode voltage drops across PN junctions, a salicide, metal, silicide, or like material is used to electrically short circuit the PN junction.

Figure 7:
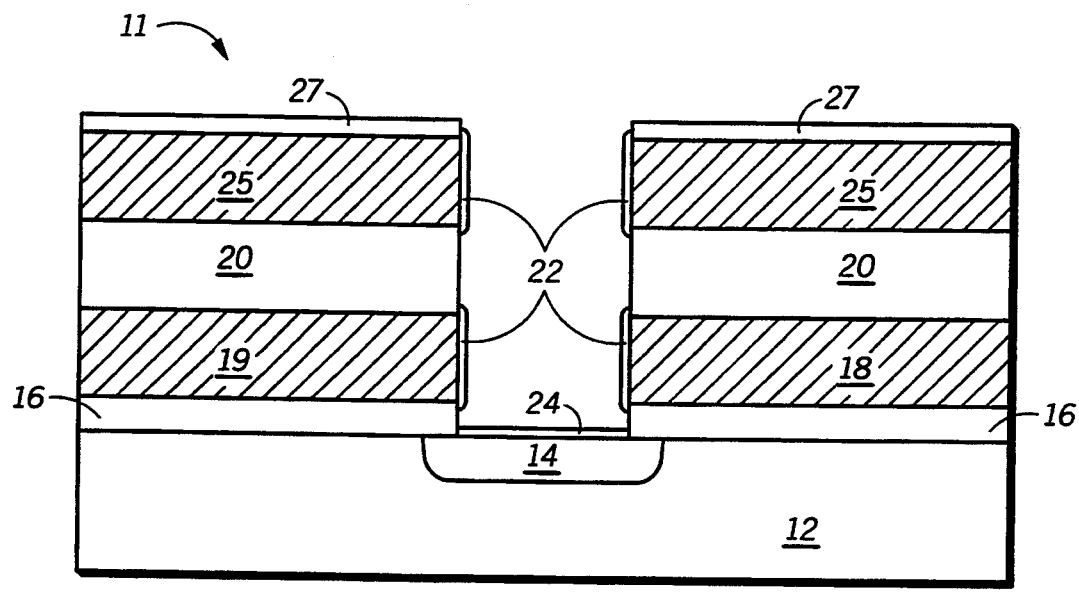
FIGS. 7-14 illustrate, in cross-sectional form, a pair of vertically stacked vertical transistors and method of formation in accordance with the present invention.

In FIGS. 7-14, elements that are analogous to elements of FIGS. 1-5 are identically labeled for brevity and therefore not explained in detail below. The elements of FIGS. 7-14 that are analogous to elements in FIGS. 1-5 should be allowed all of the alternatives and modifications described herein for FIGS. 1-5. FIG. 7 is substantially equivalent to FIGS. 1-2 and illustrates formation of dielectric layers 16, 20, and 27, formation of conductive layers 18, 19, and 25, formation of the device opening that exposes the substrate 12, formation of sidewall dielectric 22 and dielectric layer 24, and formation of the diffusion 14.

It is important to discuss the layers and regions of FIG. 7 that differ from FIGS. 1-5. Conductive layers 18 and 19 are formed from a single conductive layer in a manner similar to that illustrated in FIG. 5. Conductive layer 25 has been formed overlying the dielectric layer 20 and functions as an output conductor. In addition, a dielectric layer 27 is formed overlying the conductive layer 25. The conductive layers 18 and 19 respectively form a first conductive gate electrode and a second conductive gate electrode. Therefore, a transistor formed within the device opening and adjacent the conductive layers 18 and 19 will be double-gated. It is important to note that conductive layers 18 and 19 may be formed collectively as a single gate in FIG. 7.

Figure 8:
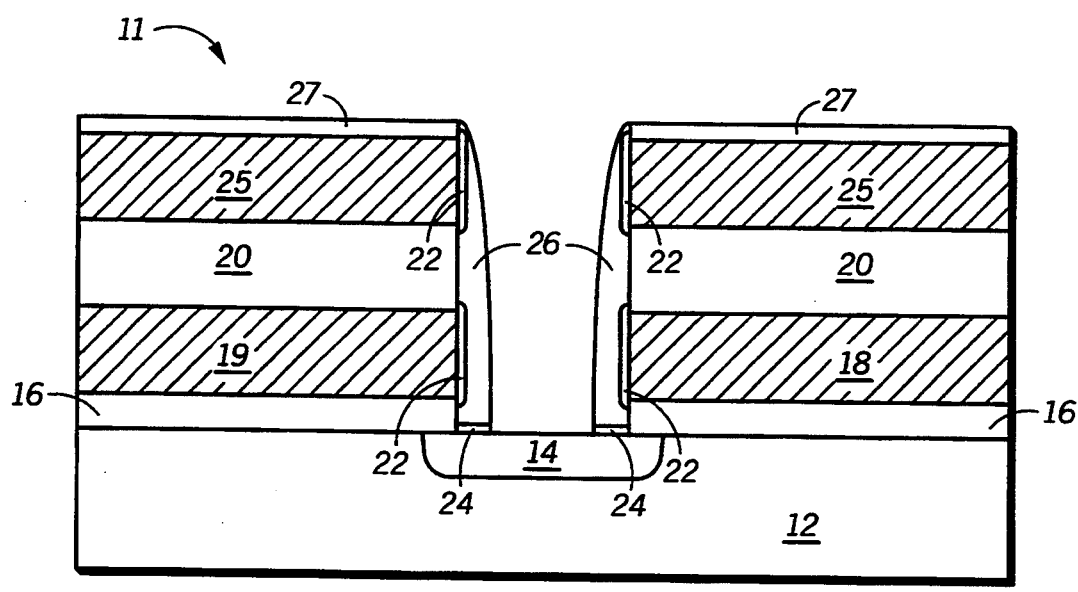

In FIG. 8, the sidewall dielectric method that utilizes a spacer 26 for protection, which was described above, is illustrated. It is important to note that the recessed sidewall approach presented herein in FIG. 6 is a viable alternative to the spacer method in FIG. 8 and vice versa. A portion of dielectric layer 25 is removed in FIG. 8.

Figure 9:
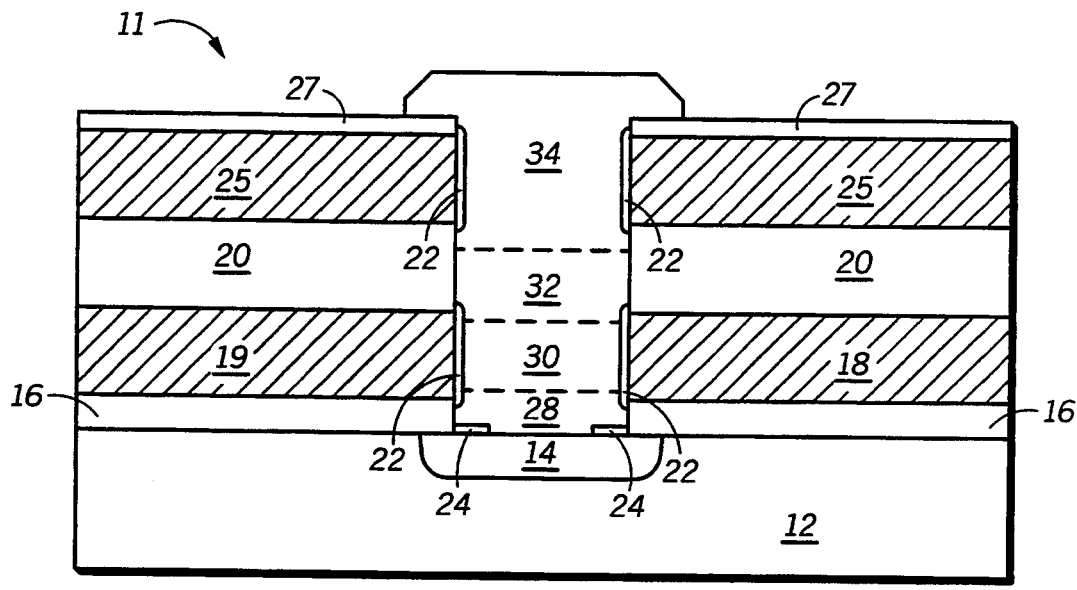

In FIG. 9, a conductive region is formed within the device opening having electrode regions and a channel region nearly identical to FIG. 4. In FIG. 9 a half LDD structure is illustrated. The method of forming electrodes and channel regions via epitaxial growth is described in detail in connection with FIG. 4. As stated previously, the conductive region that forms the electrodes and channel region may be optionally formed in a full LDD structure, a half LDD structure, or in a structure with no LDD regions. The conductive region and the conductive layers 18 and 19 form a first transistor.

Figure 10:
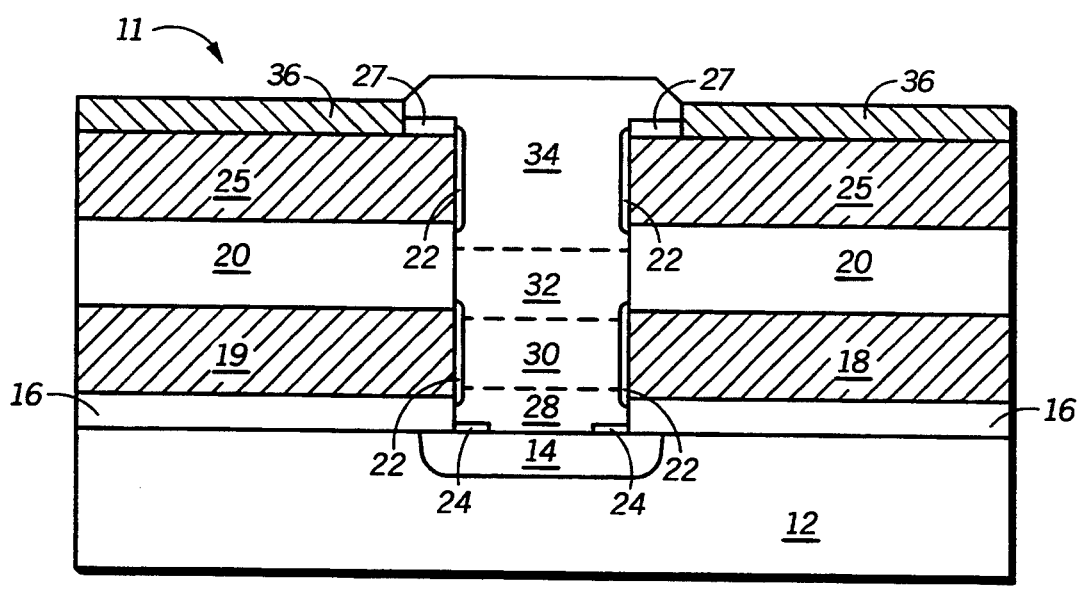

In FIG. 10, portions of the dielectric layer 27 are removed to expose portions of the conductive layer 25. A brief epitaxial growth step or a deposition and etch procedure is used to form an electrical contact between conductive layer 25 and heavily doped electrode 34. Preferably, a brief epitaxial growth step links conductive layer 25 to the heavily doped region 34 via the epitaxial link layer 36. Sidewall contacts, other forms of epitaxial growth, deposition and etch procedures, and the like can be used to form a link layer similar to layer 36.

Figure 11:
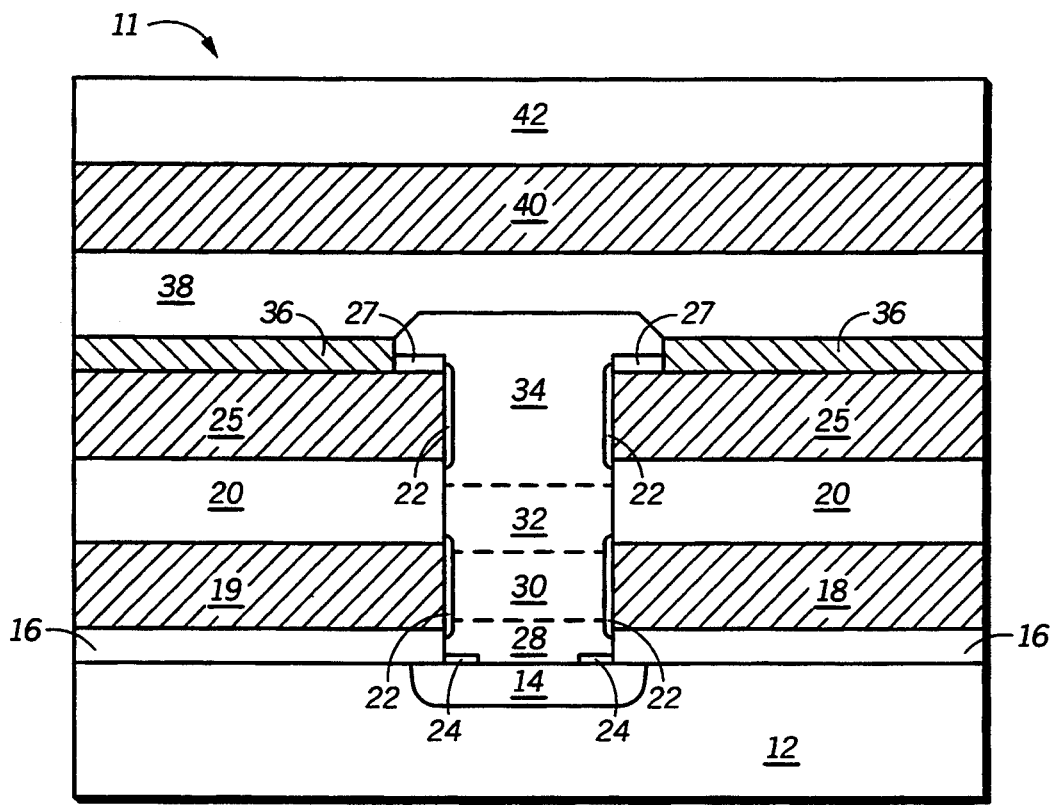

In FIG. 11, dielectric layers 38 and 42 and a conductive layer 40 are formed to allow for a formation of a second transistor. The second transistor overlies the first transistor which is gated by conductive layers 18 and 19. The second transistor uses heavily doped electrode 34 as a base layer. The base layer provides epitaxial quality material for the formation of the overlying second transistor. The dielectric layers 38 and 42 and the conductive layer 40 are formed in a manner similar to that described in FIG. 1.

Figure 12:
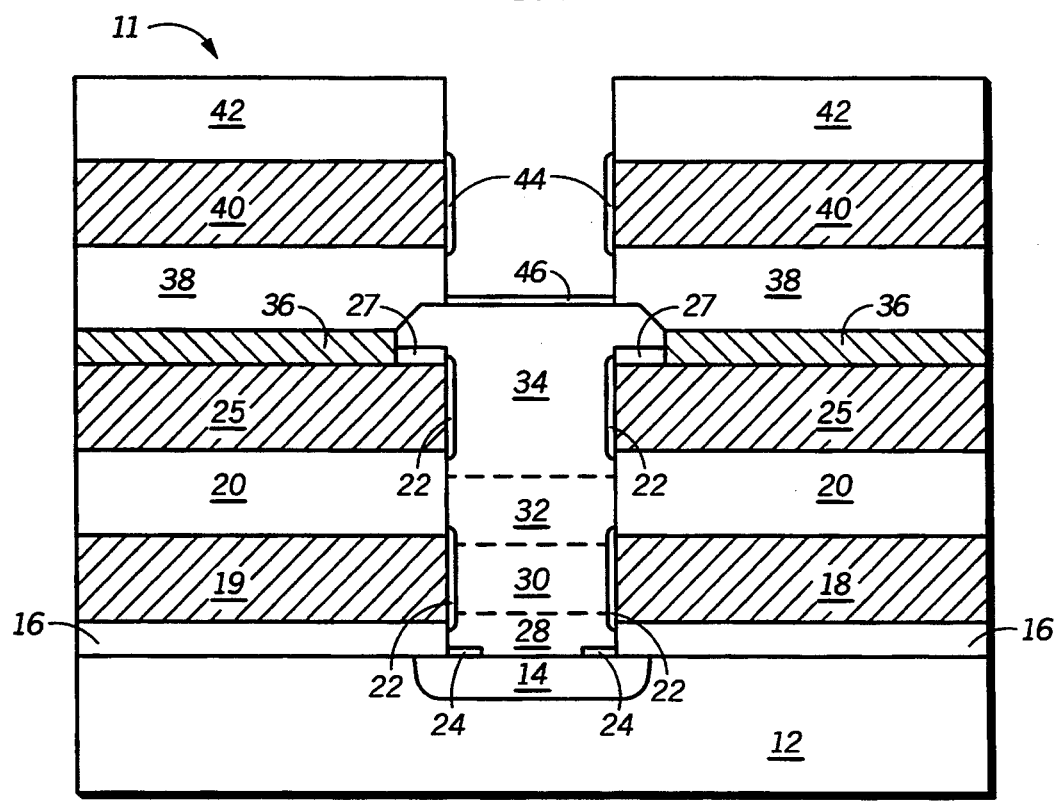

In FIG. 12, a second device opening, or second opening, is formed through the dielectric layers 38 and 42 and the conductive layer 40. A sidewall dielectric 44 is formed in a manner similar to that described in connection with FIGS. 1-2. The second transistor is single-gated by the conductor 40. Conductor 40 either completely surrounds a perimeter of the second opening or partially surrounds the perimeter of the second opening. A dielectric layer 46, analogous to dielectric layer 24 of FIG. 7, is formed overlying the heavily doped electrode 34 during sidewall dielectric layer 44 formation.

Figure 13:
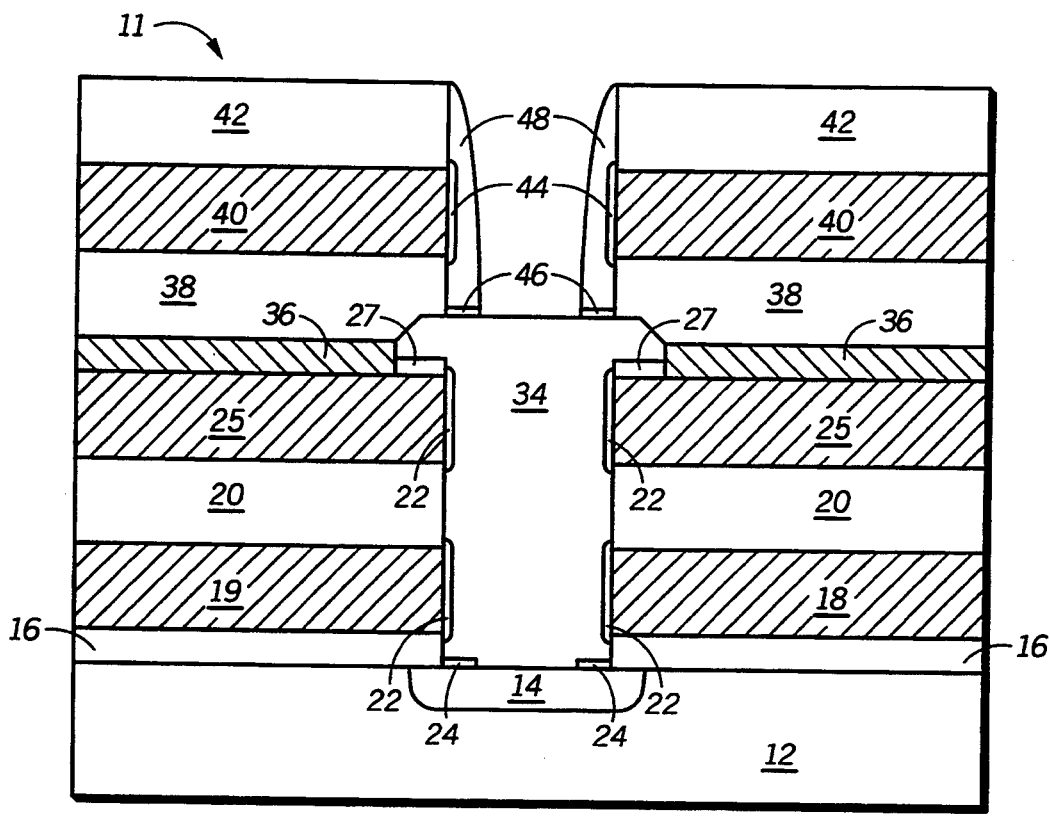
Figure 14:
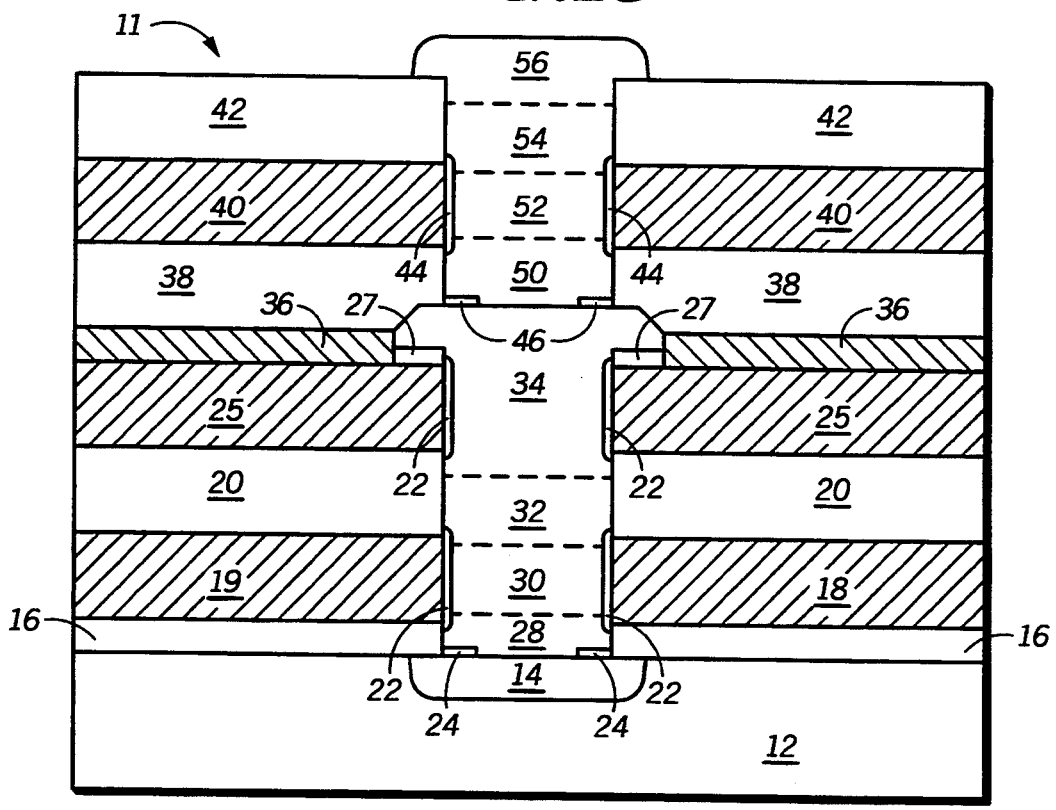

FIG. 13 illustrates a sidewall spacer and dielectric removal step analogous to that of FIG. 8. The dielectric layer 46 that is not underlying the spacer is removed. In FIG. 14, a second conductive region is formed having a first current electrode 50, a channel region 52 and a second current electrode which has sub-regions referred to as a lightly doped drain region 54 and a highly doped drain region 56.

A plurality of structures similar to the structure illustrated in FIG. 14 may be connected as taught below to form compact SRAM cells.

FIGS. 15-20 illustrate another method for forming a vertically stacked vertical transistor structure in accordance with the present invention. FIGS. 7-14 illustrate a technique wherein stacked transistors are formed one transistor at a time and with no self-alignment. FIGS. 15-20 illustrate a method wherein a plurality of transistors is formed in a stack, the transistors being self-aligned to each other. Vertical SRAM cells described herein may use either the self-aligned or the non-self-aligned method.

Figure 15:
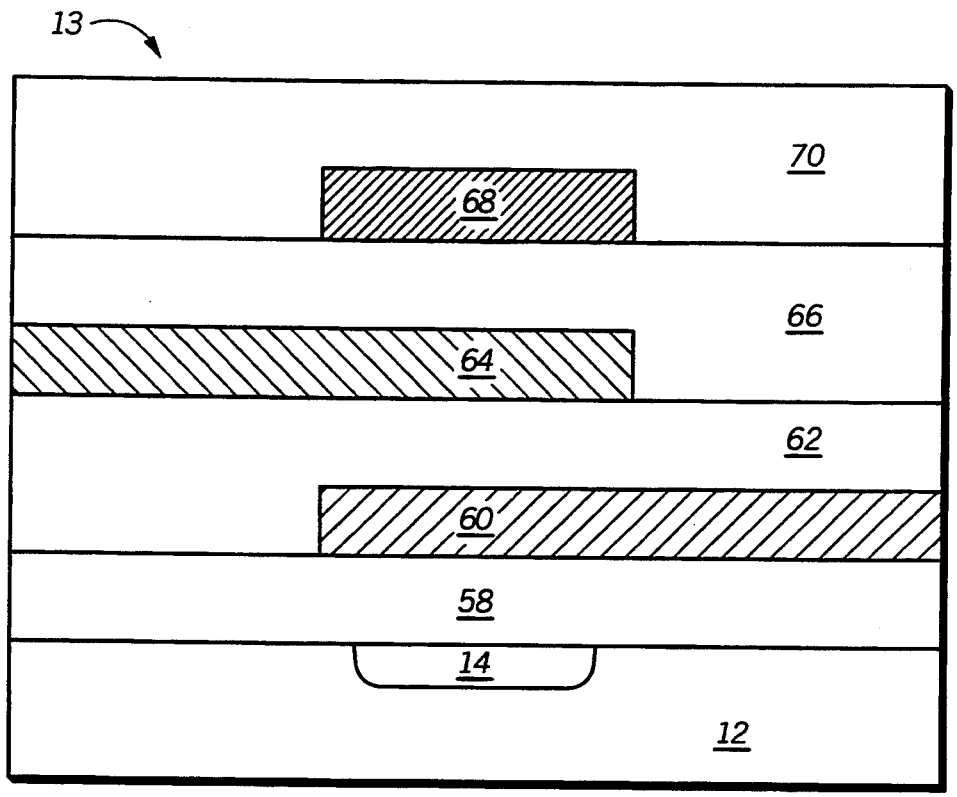
FIGS. 15-20 illustrate, in cross-sectional form, another pair of vertically stacked vertical transistors and another method of formation in accordance with the present invention.

In FIG. 15, substrate 12 and diffusion 14 are again illustrated. Regions and layers that are analogous to FIGS. 1-14 are again identically labeled in FIGS. 15-20. Conductive layers 60, 64, and 68 and dielectric layer 58, 62, 66, and 70 are formed overlying the substrate 12 as illustrated. The dielectric layers 58, 62, 66, and 70 are illustrated as being planar. Planarization is illustrated but is not required for a functional stacked device. Planarization will improve topography and reduce topographical problems in overlying conductive layers, such as metal layers. If a planarization method is not used, a "volcano-shaped" stacked logic device results.

Figure 16:
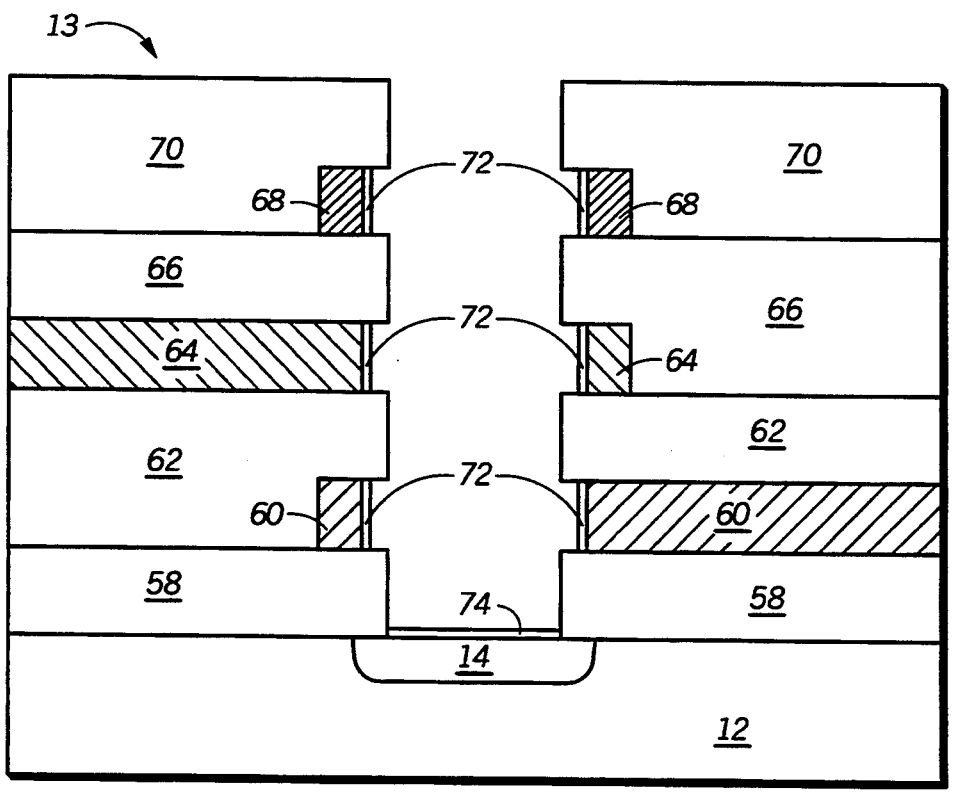

In FIG. 16, a device opening or opening is formed. The opening has sidewalls and is formed by etching portions of the conductive layers 60, 64, and 68 and dielectric layers 58, 62, 66, and 70. During the etching of the conductive layers 60, 64, and 68, the conductive layers 60, 64, and 68 are over-etched to laterally recess the sidewalls of the opening adjacent to the conductive layers 60, 64, and 68 as described in FIG. 6. This recessing allows laterally recessed sidewall dielectric layers 72 to be formed concurrently with the formation of a dielectric layer 74. Due to the fact that the dielectric layers 72 are recessed, dielectric layer 74 is etched without affecting the dielectric layers 72 as described herein.

The diffusion 14, in one form, is formed in the substrate 12 before or during formation of the conductive layers 60, 64, and 68 and dielectric layers 58, 62, 66, and 70 as illustrated in FIG. 15. In a preferred form, the diffusion 14 is formed self-aligned to the opening as in FIG. 16. In FIG. 16, all transistors that are stacked on top of one another are self-aligned to each other. Therefore, FIG. 16 illustrates a fully self-aligned process which may be used to form SRAM cells.

Figure 17:
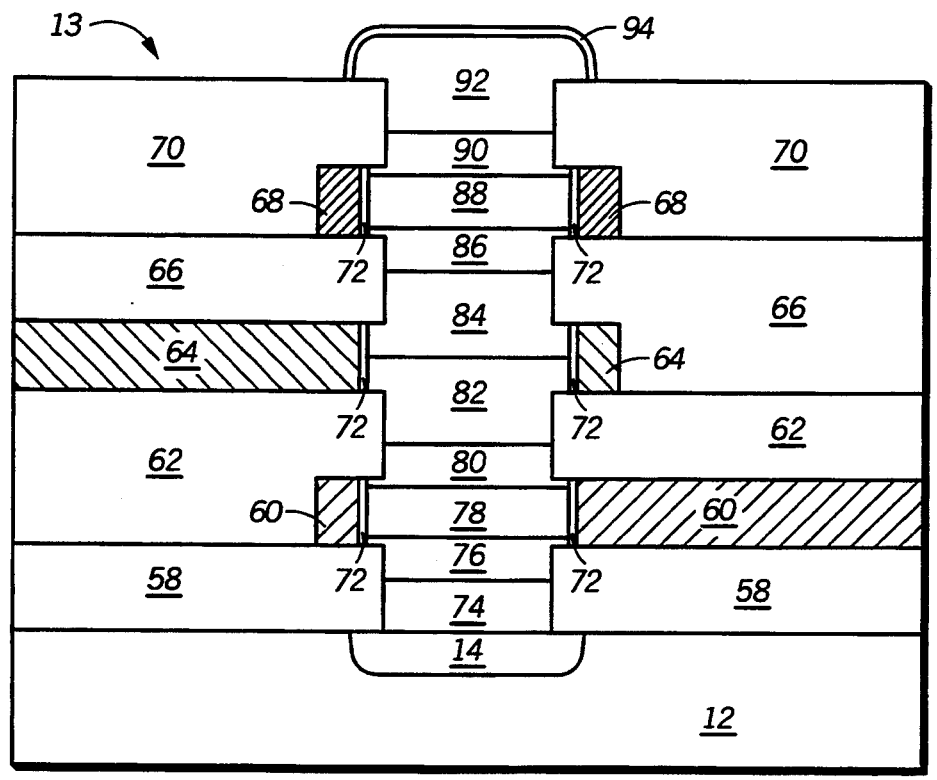

In FIG. 17, a first and a second transistor are formed one on top of the other. FIG. 17 illustrates the use of full LDD transistors. The first transistor has a first current electrode which has a lightly doped region 76 and a heavily doped region 74. The first transistor has a channel region 78. The first transistor has a second current electrode which has a lightly doped region 80 and a heavily doped region 82. A second transistor has a first current electrode which has a lightly doped region 86 and a heavily doped region 84. The second transistor has a channel region 88. The second transistor has a second current electrode which has a lightly doped region 90 and a heavily doped region 92. A dielectric layer 94 protects the heavily doped region 92 from subsequent etch processing and damage. Together, a heavily doped region and a lightly doped region form a single current electrode.

Figure 18:
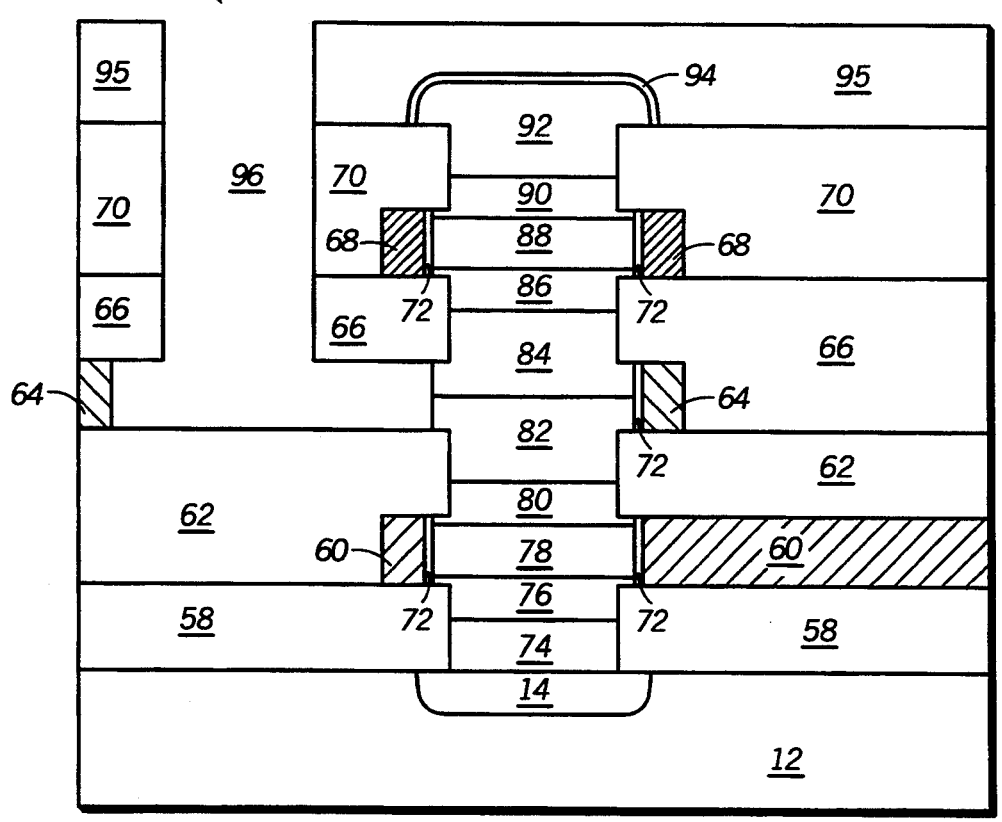

In SRAM devices, diode voltage drops (usually 0.1 V to 0.9 V) across PN junctions may not always be advantageous. Diode voltage drops are avoided by electrically short circuiting the PN junctions with a salicide, metal or like material. FIG. 18 illustrates a method that can be used for saliciding a PN junction when a fully self-aligned process, such as the process illustrated in FIG. 15, is used. An etch hole 96 is formed that exposes the conductive layer 64. An etch step is used to remove a portion of the conductive layer 64 as illustrated in FIG. 18. A short dielectric etch is used to remove the sidewall dielectric 72 exposed by the conductive layer 64 etch. A masking layer 95, which is preferably photoresist is used to protect the dielectric layer 94. The removal of the exposed sidewall dielectric 72 exposes a portion of the heavily doped regions 82 and 84.

Figure 19:
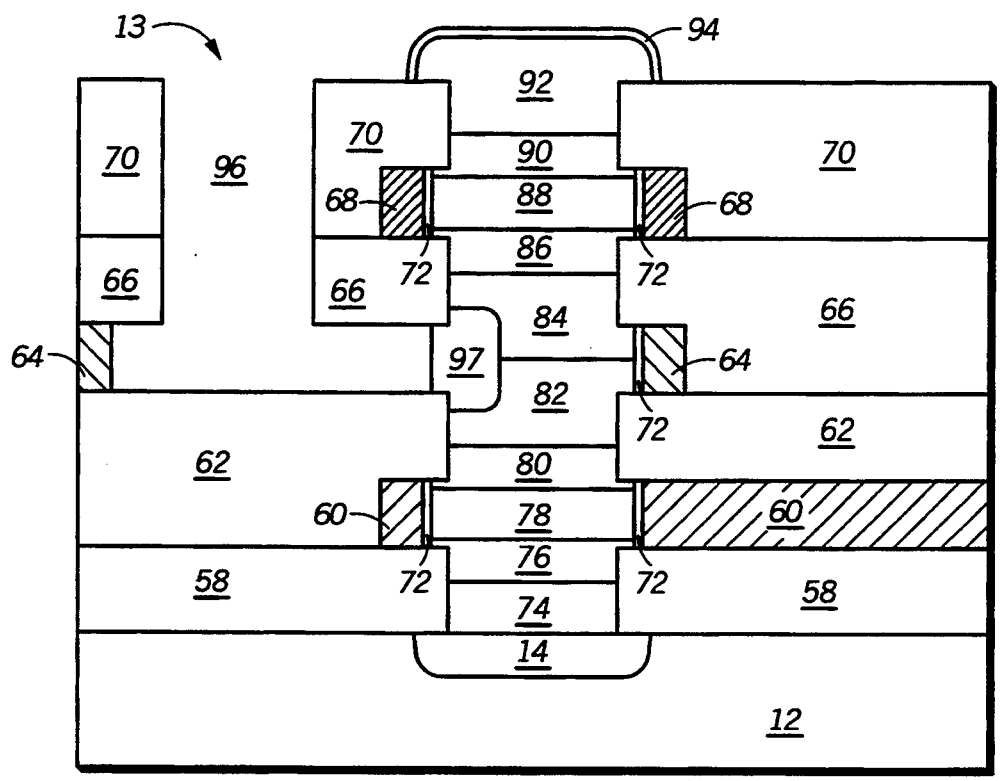

In FIG. 19, conformal CVD titanium or a like material is deposited and a salicide anneal step is performed to form a salicided region 97. An effective electrical short circuit is now bridging across the PN junction formed by the heavily doped regions 82 and 84.

Figure 20:
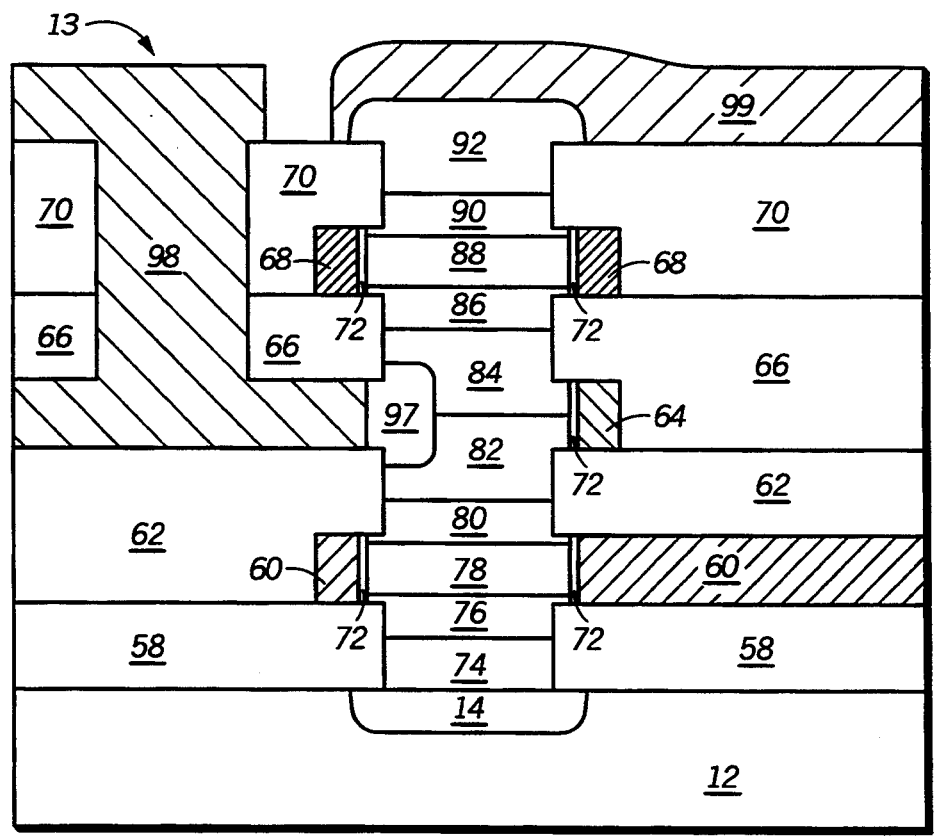

In FIG. 20, conductive regions 99 and 98 are formed to make electrical contact to the inverter gate 13. Region 98 forms an output contact of the inverter gate 13 and region 99 forms a power supply connection. In order to make electrical contact, dielectric layer 94 is removed.

It is important to note that this salicide formation step in FIGS. 18-19 is difficult because it is performed in a process that has self-aligned stacked transistors. The process of FIGS. 7-14 is more suitable for a salicide formation step due to the fact that one transistor is formed at a time. A conventional deposition, etch, and anneal cycle can form a salicide region on a first transistor's heavily doped region before the second transistor's heavily doped region is formed, thereby electrically short circuiting the resulting PN junction. The only disadvantage with this approach is that the resulting salicide region could impede epitaxial growth of conductive regions if formed over a large surface area of the heavily doped regions. Deciding one method over the other is design choice and depends upon an application of the device, available equipment, and equipment capabilities.

If a plurality of structures similar to the structure illustrated via FIG. 20 is electrically connected and doped in a proper manner, an SRAM cell or a plurality of SRAM cells may be manufactured as taught below.

Figure 21:
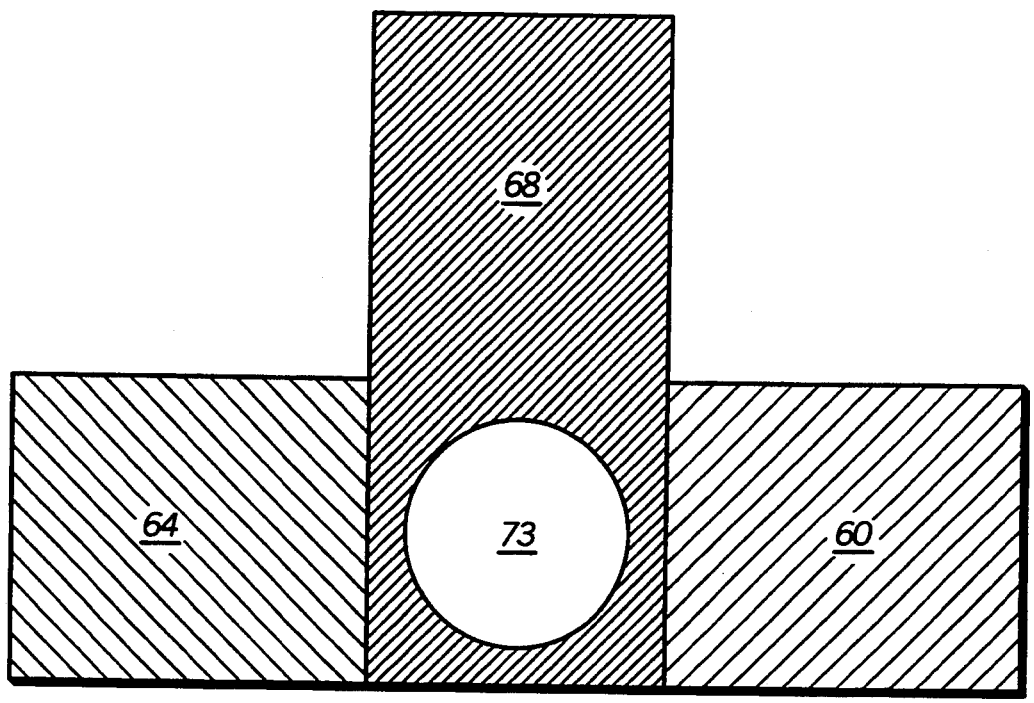
FIG. 21 illustrates, in top perspective view, one top perspective embodiment of the pair of vertically stacked vertical transistors of FIG. 20.

In FIG. 21, the structure of FIG. 20 is illustrated in a top perspective view. Only conductive layers 60, 64, and 68 are illustrated along with the opening which is illustrated in FIG. 21 as opening 73.

Figure 22:
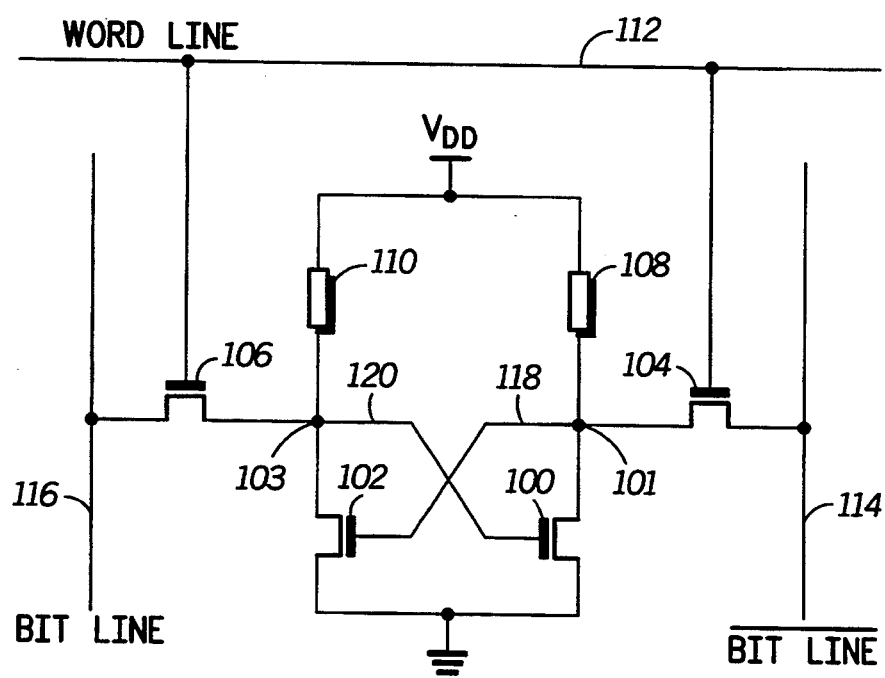
FIG. 22 illustrates, in schematic form, a conventional static random access memory (SRAM)

FIG. 22 illustrates in a schematic diagram a conventional SRAM cell. FIG. 22 illustrates N-type latch transistors 100 and 102, N-type pass transistors 104 and 106, and resistive devices 108 and 110. An interconnection 118 connects the transistors 104 and 100 to the gate of transistor 102. An interconnection 120 connects the transistors 102 and 106 to the gate of transistor 100. The resistive devices 108 and 110 may be resistor elements, diodes, thin film transistors (TFTs), P-type transistors, or the like. If resistive devices 108 and 110 are transistor devices, then interconnection 118 connects to a gate of resistive device 110 and interconnection 120 connects to a gate of resistive device 108. Power supply (Vdd) and ground connections are illustrated in FIG. 22. Bit lines 114 and 116 and a word line 112 are illustrated. FIG. 22 also illustrates transistor nodes 101 and 103.

Figure 23:
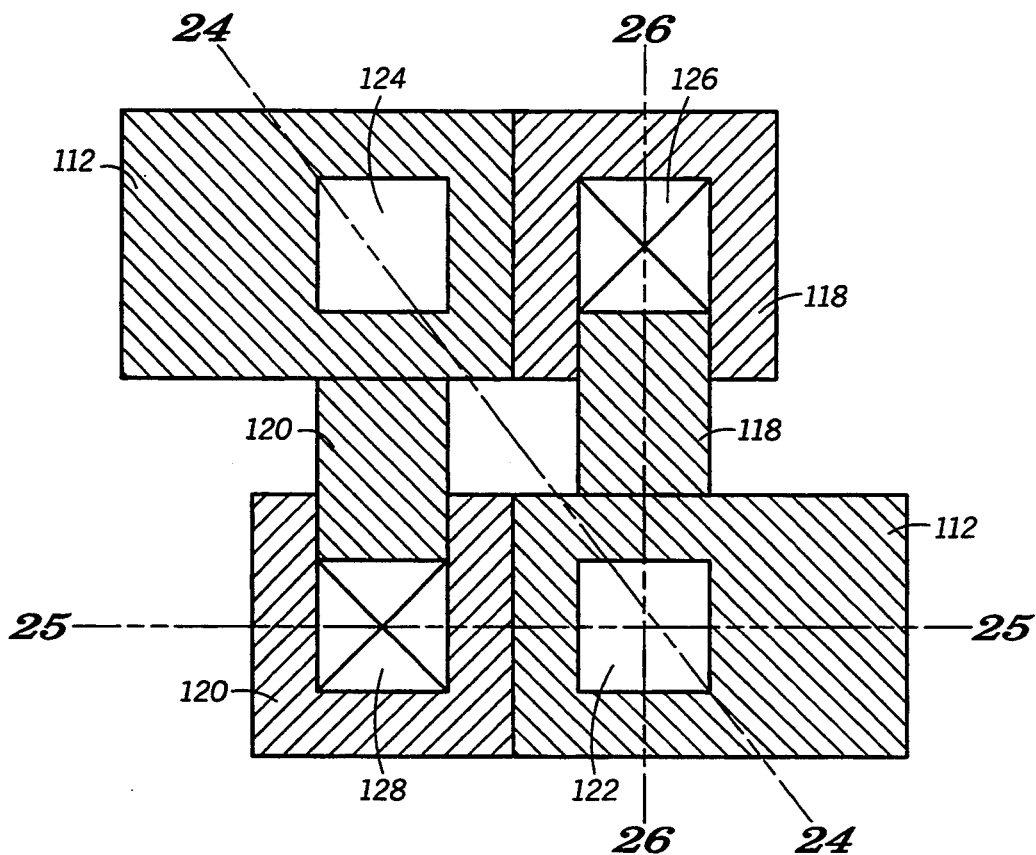
FIG. 23 illustrates, in top perspective view, a static random access memory (SRAM) in accordance with the present invention.

FIG. 23 illustrated in top perspective view a layout which may be used to form an SRAM cell in accordance with the present invention. A vertical transistor stack 124 contains two transistors and is one lithographic feature in dimension. The vertical transistor stack 124 is formed using the techniques taught in FIGS. 1-21 and contains two stacked vertical transistors (similar to FIG. 14 or FIG. 20). The two stacked transistors are analogous to the transistors 102 and 106 of FIG. 22. Transistor 102 is formed underlying transistor 106 in this embodiment. A vertical transistor stack 122 contains two transistors and is one lithographic feature in dimension. The vertical transistor stack 122 is formed using the techniques taught in FIGS. 1-21 and contains two stacked vertical transistors (similar to FIG. 14 or FIG. 20). The two stacked transistors are analogous to the transistors 100 and 104 of FIG. 22. Transistor 100 is formed underlying transistor 104 in this embodiment.

Figure 25:
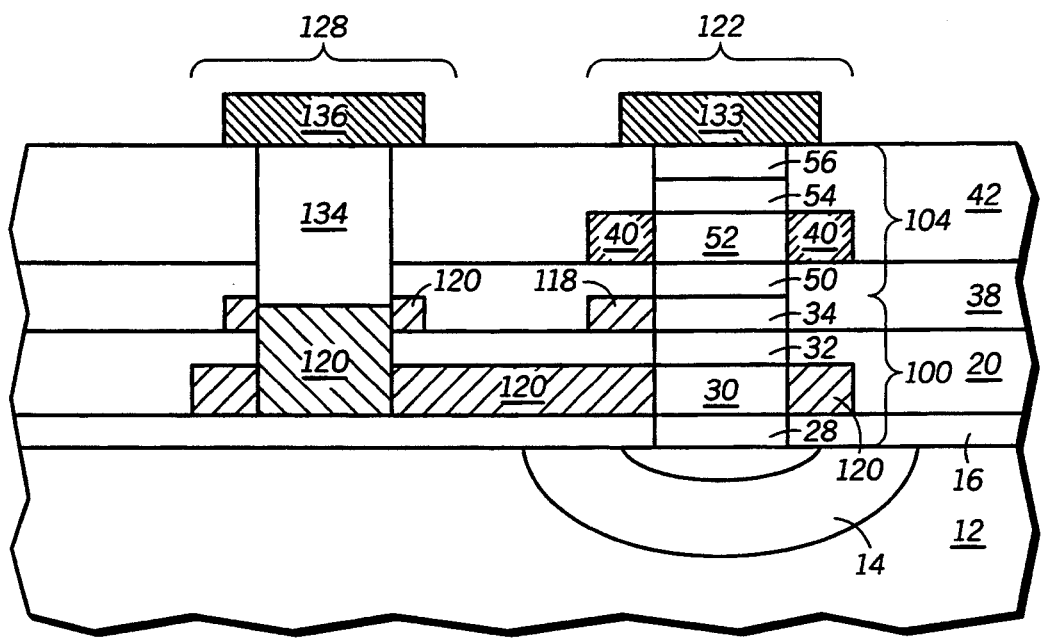
FIG. 25 illustrates, in cross-sectional form, the static random access memory of FIG. 23 cross-sectioned along line 25—25.
Figure 26:
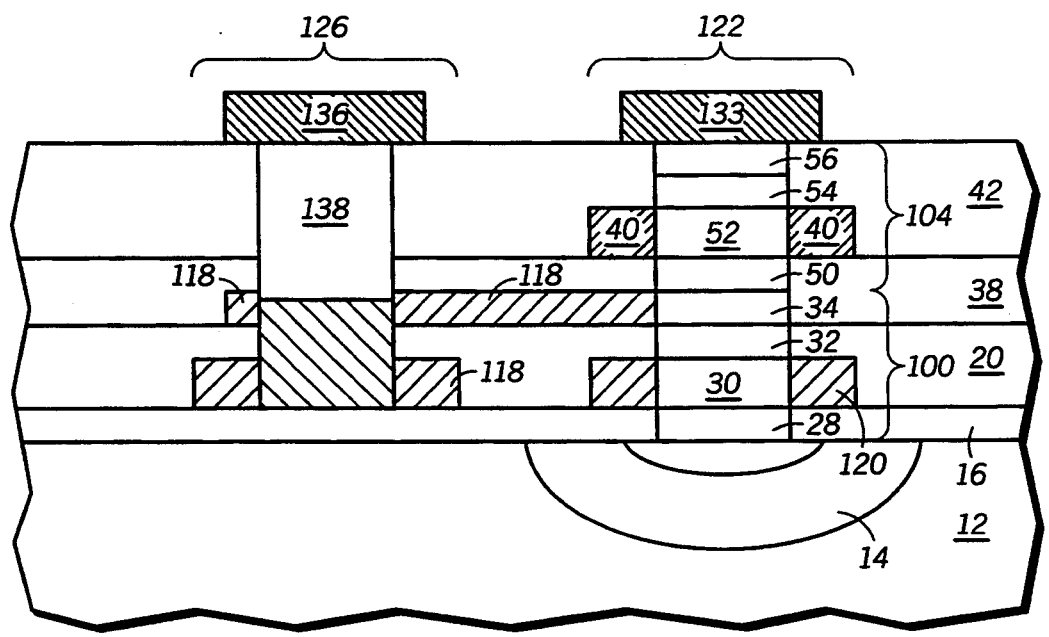
FIG. 26 illustrates, in cross-sectional form, the static random access memory of FIG. 23 cross-sectioned along line 26—26.

In FIG. 23, the interconnect 118 connects the transistor node 101 (see FIG. 22) which lies between transistors 100 and 104 within vertical transistor stack 122 to the gate of transistor 102 located within the vertical transistor stack 124. In FIG. 23, interconnect 118 is preferably made of polysilicon or a like conductor or semiconductor. The interconnect 120 connects the transistor node 103 (see FIG. 22) which lies between transistors 102 and 106 within vertical transistor stack 124 to the gate of transistor 100 located within the vertical transistor stack 122. In FIG. 23, interconnect 120 is preferably made of polysilicon or a like conductor or semiconductor. Interconnects 118 and 120 are respectively connected between the vertical transistor stacks 122 and 124 via vertical stacks 126 and 128. Interconnects 118 and 120 are analogous to connecting conductive layer 25 of a first transistor stack formed in accordance with FIG. 14 to conductive layer 18 of a second transistor stack also formed in accordance with FIG. 14. Interconnects 118 and 120 are illustrated in subsequent cross-sectional diagrams (FIGS. 24-26).

Word lines 112 are illustrated in FIG. 23. Word lines 112 are, for example, each analogous to conductive layer 60 of FIG. 20. A diffusion (not illustrated) carries a ground potential along line 24—24 of FIG. 23 and connects to the bottom of each of the vertical transistor stacks 122 and 124. This diffusion (not illustrated) may be a straight diagonally-directed diffusion or may be zig-zagged in geometric structure. In addition, the diffusions illustrated herein may be salicided or silicided. An ion implant step, which implants a refractory metal material such as cobalt into the diffusion, may be used to form a buried silicide or salicide layer within the diffusion. Other silicide/salicide methods and materials exist. Silicides and/or salicides form diffusions with a greater conductivity.

The vertical stack 126 contains either a resistor device or a TFT device analogous to resistive device 108 of FIG. 22. The vertical stack 126 contains either a resistor device or a TFT device analogous to resistive device 110 of FIG. 22. These TFT or resistive devices are connected to a power supply conductor (not illustrated in FIG. 23) at a top portion of the vertical stacks 126 and 128. These connections are illustrated in more detail in FIGS. 24-26.

Figure 24:
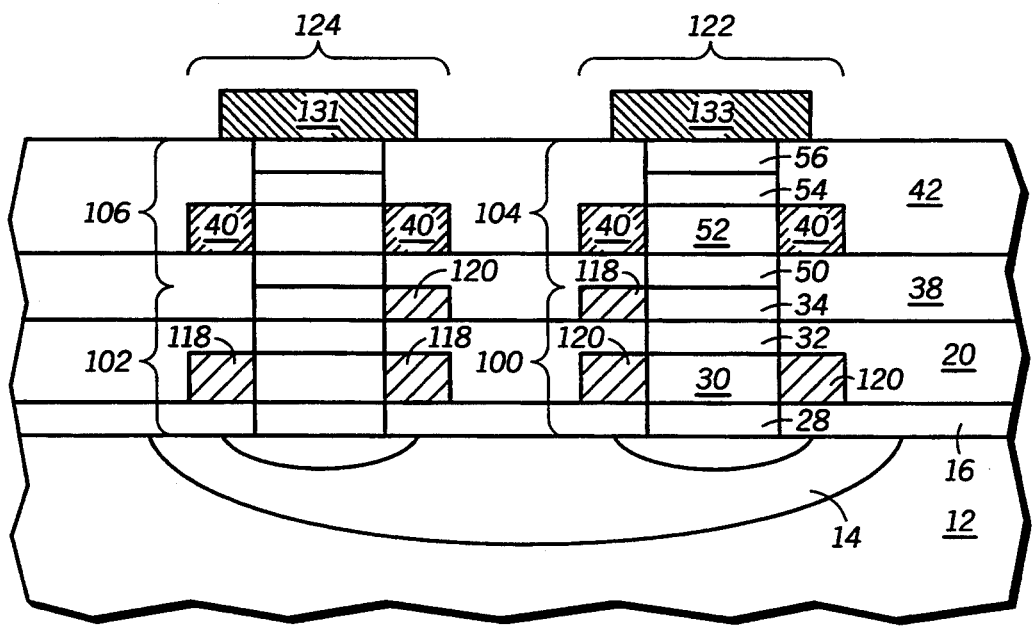
FIG. 24 illustrates, in cross-sectional form, the static random access memory of FIG. 23 cross-sectioned along line 24—24.

FIG. 24 illustrated FIG. 23 cross-sectioned along the line 24—24. FIG. 24 illustrates the vertical transistor stacks 122 and 124 of FIG. 23. In FIG. 24, the vertical transistor stack 122 holds the transistor 100 of FIG. 22 and the transistor 104 of FIG. 22 as illustrated. The vertical transistor stack is analogous to the structure taught in FIG. 14 or FIG. 20 and therefore analogous elements of FIG. 24 are labeled identical to FIG. 14. The diffusion 14 carries a ground (Vss) signal.

The vertical transistor stack 124 is similar to the vertical transistor stack 122 and FIGS. 14 and 20 in structure and is therefore not specifically labeled. The vertical transistor stack 124 is used to form transistors 102 and 106 of FIG. 22. Conductive layer 40 of FIG. 24 forms the word line 112 illustrated in FIG. 22. The interconnection 118 and 120 of FIG. 22 are illustrated in FIG. 24 as first and second polysilicon layers. Interconnection 120 connects the transistors 102 and 106 to the gate of transistor 100 via a connection within the vertical stack 128. Interconnection 118 connects the transistors 100 and 104 to the gate of transistor 102 via a connection within the vertical stack 126.

The vertical transistor stacks 124 and 122 may be formed simultaneously. All four transistors 100, 102, 104, and 106 are N-type and therefore require no silicide electrical short circuit regions as taught in FIG. 20.

FIG. 25 illustrates FIG. 23 cross-sectioned along a line 25—25. The vertical transistor stack 122 of FIG. 23 is illustrated and the vertical stack 128 of FIG. 23 is illustrated. The vertical transistor stack 122 of FIG. 25 is the same vertical transistor stack 122 illustrated in FIG. 24. The only difference is that the vertical transistor stack 122 of FIG. 25 is cross-sectioned from a different direction (line 25—25 instead of line 24—24).

In FIG. 25, the vertical stack 128 is illustrated. The interconnect 120 connects the gate of transistor 100 to the transistors 102 and 106 (the output node 103 of FIG. 22). A portion of the vertical stack 128 is used to vertically strap two conductive layers to form interconnect 120 as illustrated in FIG. 25. A top portion of the vertical stack 128 is used to form a resistive device 134 analogous to resistive device 110 of FIG. 22. Preferably, the resistive device is a polysilicon resistor element or a resistor element formed from a resistive material. The resistor element may be doped, compensated, or undoped. A conductive layer 136, which is preferably a metal material, connects the resistive device 134 to a power supply voltage (Vdd).

The resistive device 134 may be formed by plug and planarization/etch-back processing, epitaxial growth, or the like. In another form, the resistive device 134 may be formed as a thin film transistor (TFT) or a vertical polysilicon transistor by the process illustrated in FIGS. 1-6.

FIG. 26 illustrates FIG. 23 cross-sectioned along a line 26—26. The vertical transistor stack 122 of FIG. 23 is illustrated and the vertical stack 126 of FIG. 23 is illustrated. The vertical transistor stack 122 of FIG. 26 is the same vertical transistor stack 122 illustrated in FIG. 24. The only difference is that the vertical transistor stack 122 of FIG. 26 is cross-sectioned from a different direction (line 26—26 instead of line 24—24).

In FIG. 26, the vertical stack 126 is illustrated. The interconnect 118 connects the gate of transistor 102 to the transistors 100 and 104 (the output node 101 of FIG. 22). A portion of the vertical stack 125 is used to vertically strap two conductive layers to form interconnect 118 as illustrated in FIG. 25. A top portion of the vertical stack 126 is used to form a resistive device 138 analogous to resistive device 108 of FIG. 22. Preferably, the resistive device is a polysilicon resistor element or a resistor element formed from a resistive material. The resistor element may be doped, compensated, or undoped. A conductive layer 136, which is preferably a metal material, connects the resistive device 138 to a power supply voltage (Vdd).

The resistive device 138 may be formed by plug and planarization/etch-back processing, epitaxial growth, or the like. In another form, the resistive device 138 may be formed as a thin film transistor (TFT) or a vertical polysilicon transistor by the process illustrated in FIGS. 1-6.

Now that an SRAM cell has been illustrated (FIGS. 23–25) and methods for forming stacked transistors have been illustrated (FIGS. 1–21), a top down process flow of SRAM device-critical layers is illustrated in FIGS. 27–33 to further describe the method of manufacturing the SRAM of FIGS. 23–26. FIG. 22 illustrates a first layout and the FIGS. 27–33 illustrate a second layout. Some of the dielectric layers, substrate layers, diffusions, and like layers are not illustrated in FIGS. 23–26. Only conductive layers are illustrated in FIGS. 27–33 for clarity, and only one SRAM cell is completely labeled.

Figure 27:
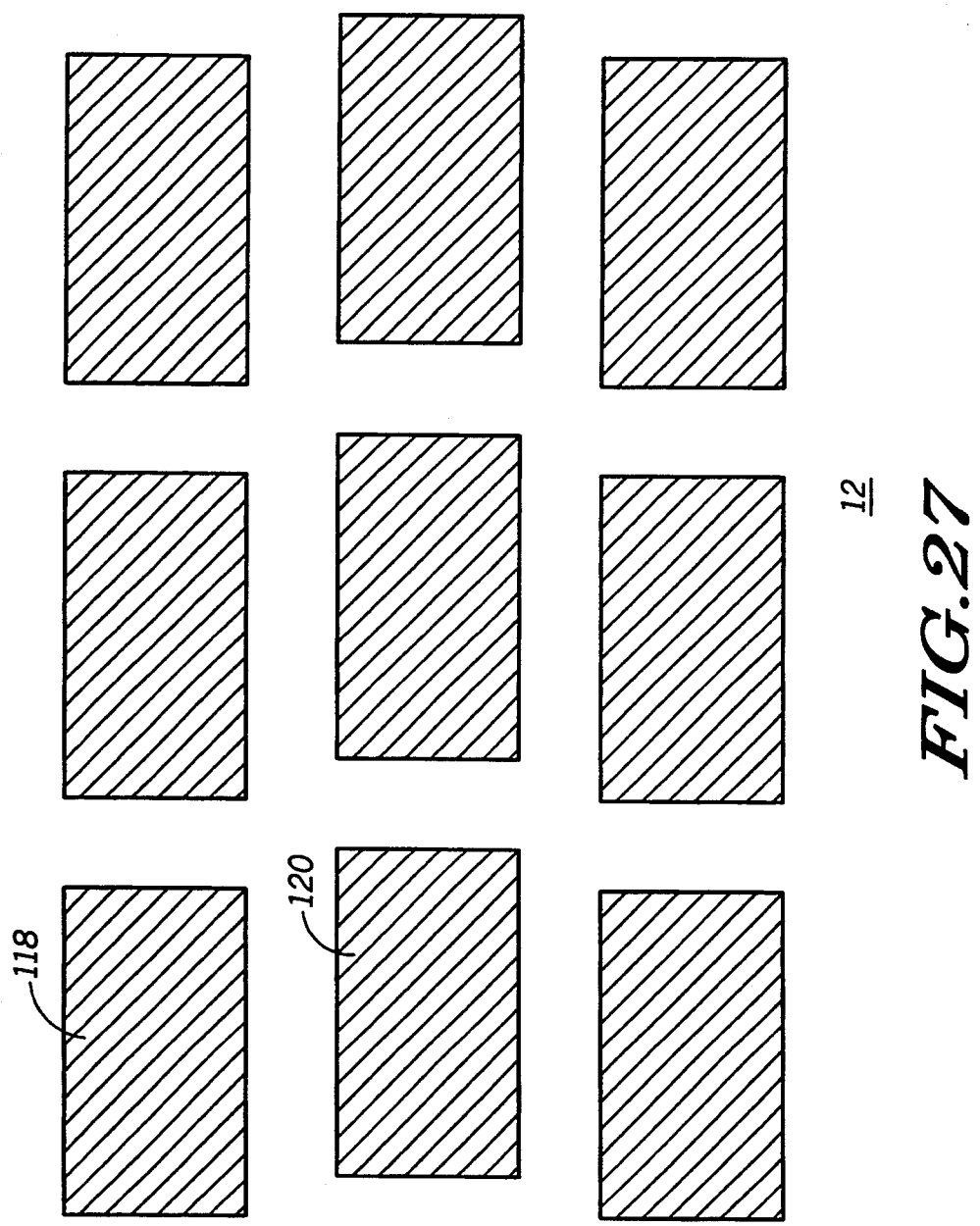
FIGS. 27-33 illustrates, in top perspective view, a method for making another static random access memory (SRAM) in accordance with the present invention.

In FIG. 27, a substrate 12 is provided. Diffusions (not illustrated) are formed within the substrate 12 to carry ground potentials, other potentials, or logic signals as required. The diffusions (not illustrated) are optionally salicided or silicided as taught herein. A first dielectric layer (not illustrated) is formed corresponding to dielectric layer 16 of FIG. 24. Polysilicon, polycide, or a like layer is formed and patterned to create first conductive layer. The first conductive layer forms portions of the interconnections 118 and 120 as illustrated. Doping of the first conductive layer is performed by in-situ doping, diffusion, ion implantation, or the like.

Figure 28:
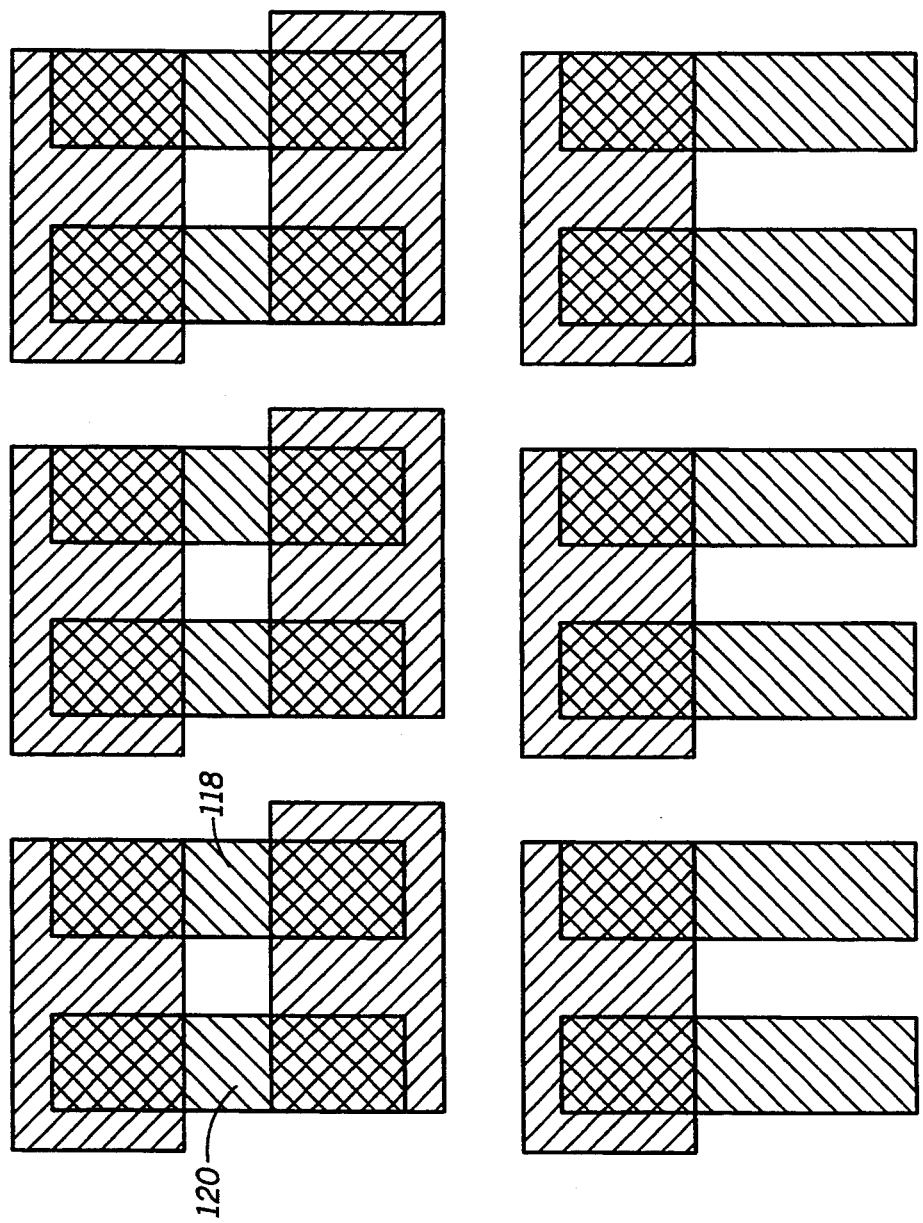

In FIG. 28, a second dielectric layer (not illustrated) is formed corresponding to the dielectric layer 20 of FIG. 24. Planarization of the dielectric layers described herein is optional. A second conductive layer, which is preferably polysilicon, amorphous silicon, polycide, or a like material, is formed and patterned over the second dielectric layer (not illustrated). The second dielectric layer is used to form another portion of the interconnects 118 and 120 as illustrated. Doping of the second conductive layer is performed by in-situ doping, diffusion, ion implantation, or the like.

Figure 29:
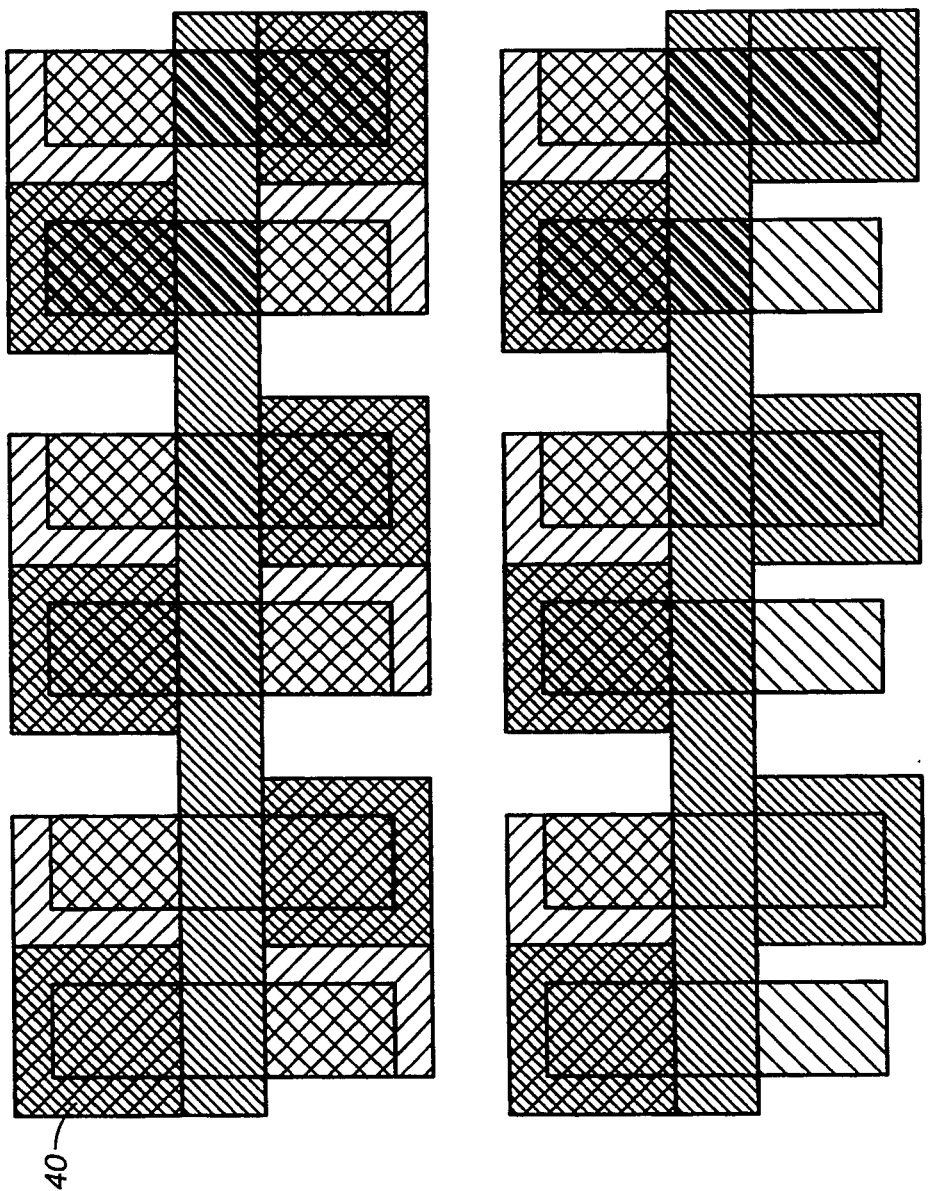

In FIG. 29, a third dielectric layer (not illustrated) is formed corresponding to the dielectric layer 38 of FIG. 24. Planarization of the third dielectric layer (not illustrated) is optional. A third conductive layer, which is preferably polysilicon, amorphous silicon, polycide, or a like material, is formed and patterned over the second dielectric layer (not illustrated). The third dielectric layer is used to form the word lines of the SRAM cell which are analogous to the conductive layer 40 of FIG. 24. Doping of the third conductive layer is performed by in-situ doping, diffusion, ion implantation, or the like.

Figure 30:
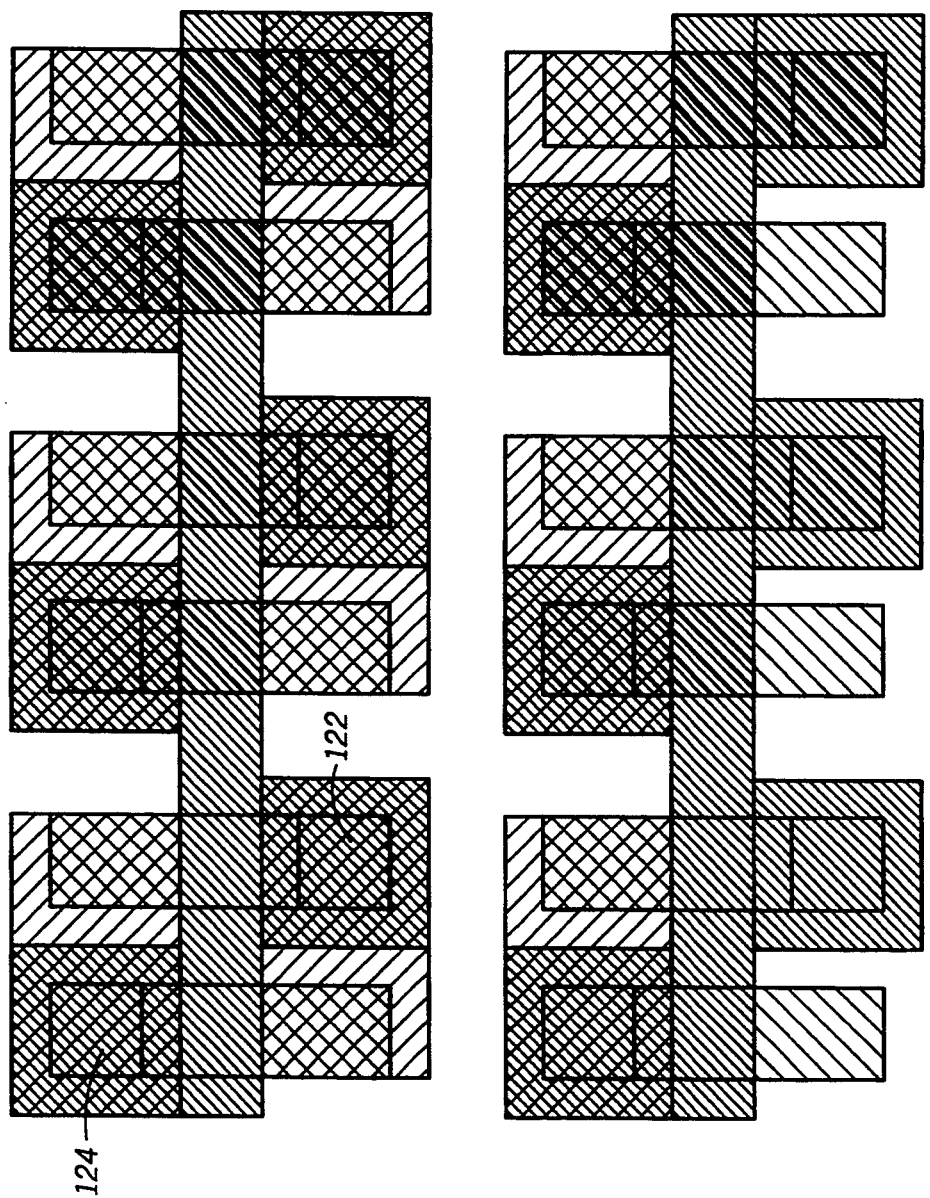

In FIG. 30, contact holes are formed and the vertical transistor stacks 122 and 124 are formed as taught herein. All four of the transistors (transistors 100, 102, 104, and 106) formed within the vertical transistor stacks 122 and 124 are vertical N-type transistors. Epitaxial growth, as taught herein, is preferred for the formation of the four transistors. The vertical transistor stacks 122 and 124 may be formed sequentially or simultaneously.

Figure 31:
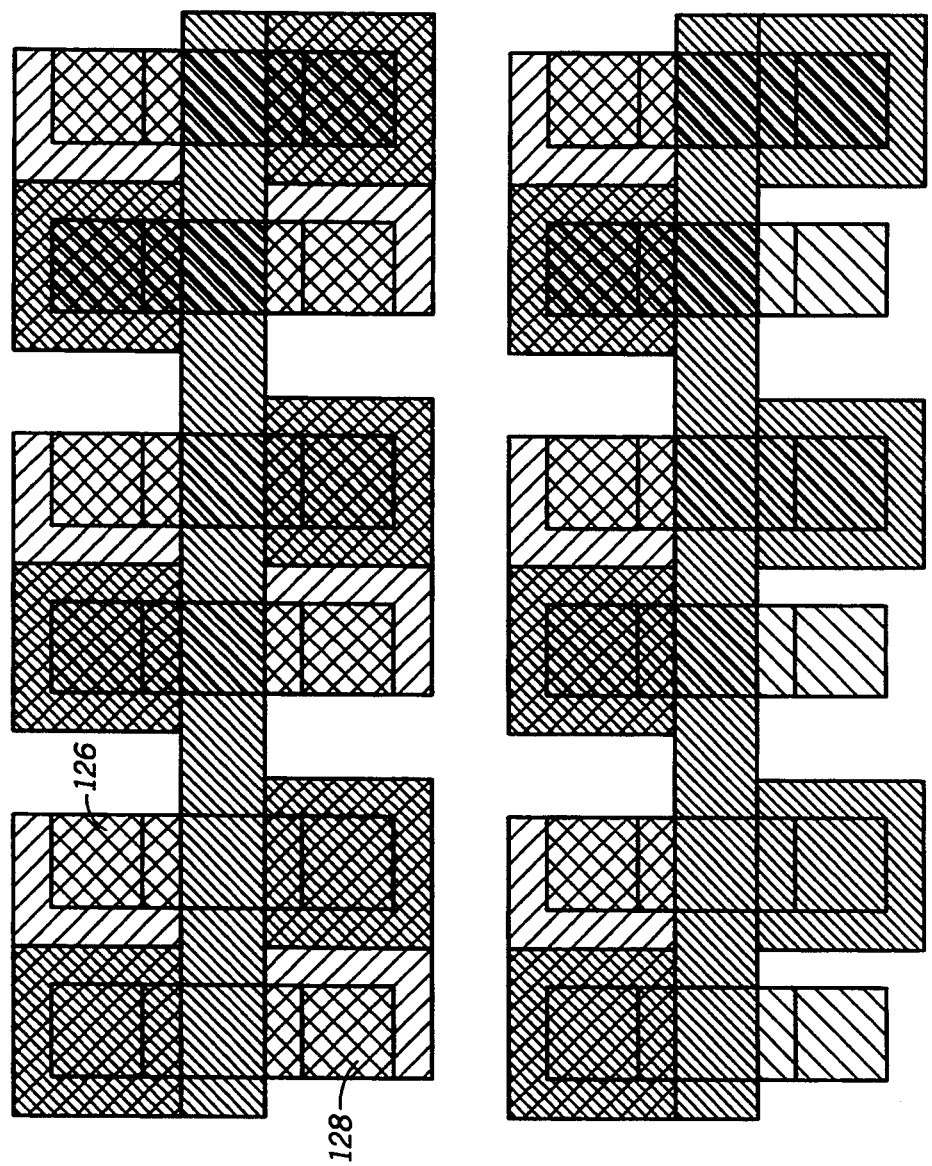

In FIG. 31, contact holes are formed and the vertical stacks 126 and 128 are formed as taught herein. The vertical stacks 126 and 128 complete the electrical connection of the interconnects 118 and 120. In addition, a top portion of the vertical stacks 126 and 128 are used to form resistive devices analogous to resistive devices 134 and 138 of FIGS. 25 and 26. The vertical stacks 126 and 128 may be formed sequentially or simultaneously.

Figure 32:
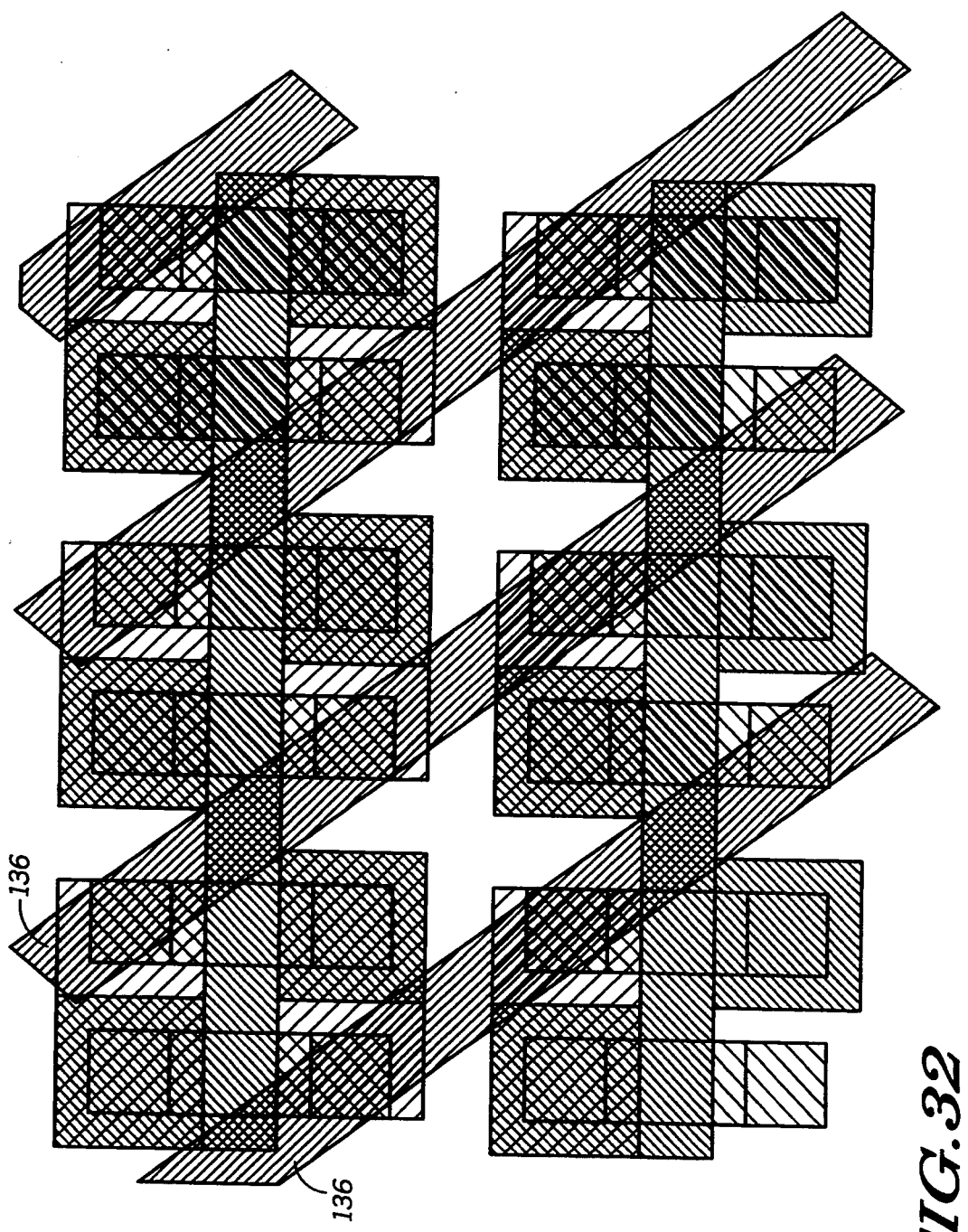

In FIG. 32, a conventional inter-level dielectric (not labeled) is formed and a conductive layer 136 is formed to connect a top portion of the vertical stacks 126 and 128 to a power supply potential (Vdd). The conductive layer 136 is preferably a metal layer.

Figure 33:
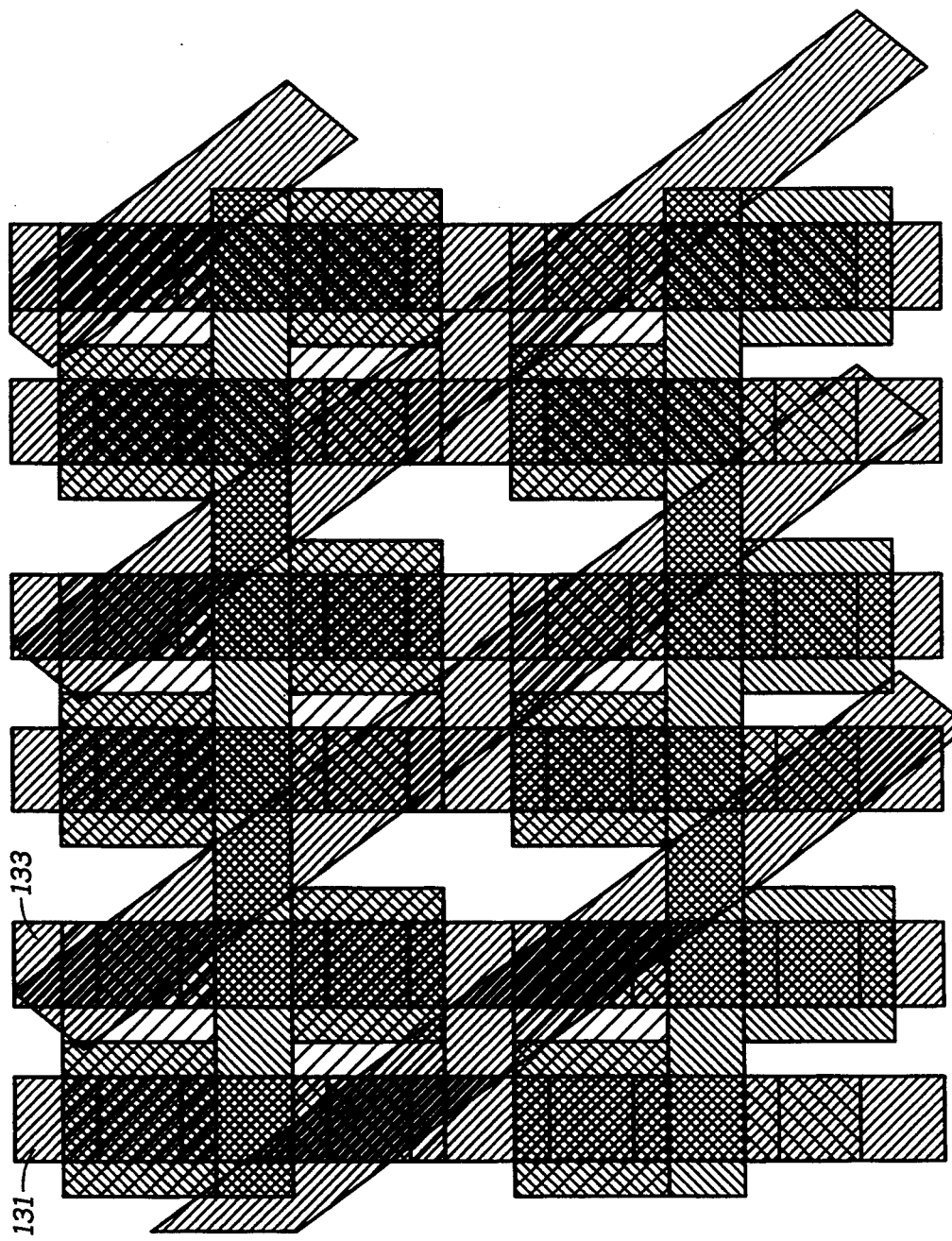

In FIG. 33, a second conventional inter-level dielectric (not labeled) is formed and a conductive layer 131 and a conductive layer 133 is formed to connect a top portion of the vertical transistor stacks 122 and 124. The conductive layers 131 and 133 form a pair of bit lines for the SRAM cell. Typically, the conductive layers 131 and 133 are formed in a single metal layer and carry complementary logic signals.

The inventive methods and devices presented herein for SRAM formation provide vertical transistor logic and vertical circuits that have reduced surface area, improved short channel behavior, and reduced channel length variation. Leakage currents are reduced due to the fact that current electrodes and channel regions are isolated from the substrate. A length of the transistor 10 is controlled by a conductive layer 18 deposition thickness L as illustrated in FIG. 1. Therefore, the inventive transistor has gate and channel lengths that are independent of lithography, smaller than lithography allows, and controlled within a smaller variation. In addition, deposition thickness L, and not increased substrate surface area, may be used to adjust P-channel device aspect ratios and device characteristics to match N-channel device characteristics.

The device width of the transistors used to form the inventive memory device taught herein is larger than conventional planar transistors of the same surface area due to the fact that the channel width of a cylindrical transistor is the cylinder's circumference. It should be noted the contact holes taught herein not required to be spherical, and may be triangular, rectangular, oval, a square, or other geometries. Due to the smaller channel length and the greater channel width, a current carrying capability of the transistor logic increases without increasing logic circuit surface area. In almost all cases, SRAM cell substrate surface area will be between 3 square microns and sub-one square micron for the SRAM cell technology taught herein.

The inventive memory device is formed within a contact hole which is lithographically the smallest feature size in an integrated circuit. In addition, the formation of the inventive SRAM cell may require only a few photolithography steps if the SRAM is formed entirely self-aligned as in FIGS. 15–16. One mask is all that is needed for transistor source electrode, drain electrode, and channel region formation even if the transistors are formed sequentially one at a time. Many features of the transistors taught herein, such as diffusions and gates, can be self-aligned. Asymmetric source and drain electrodes result and LDD and half LDD transistors are easily formed. Bulk inversion of the channel region can be achieved for sub-micron channel region dimensions. Low logic off current, known cross-talk phenomenon, and current leakage to the substrate is minimized due to the fact that many diffusions are placed in series and isolated from the substrate.

Due to the fact that the inventive SRAM cell has transistors which are placed physically closer to each other than conventional SRAM cell transistors, the inventive SRAM cell will avoid many polysilicon, silicon, and metal junctions, and may have increased speed of operation.

In some cases, the inventive SRAM may be formed having transistors in an opening that is too large to fully deplete. Fully depleted transistors and bulk inverted transistor are advantageous and possible for the transistor taught herein if small lithographic geometries are achieved. Full channel region depletion or bulk channel inversion is also desirable for large geometry transistors in order to achieve improved performance. If a sidewall contact is made to the inventive transistor channel region and the sidewall contact is connected to the substrate or a power supply, depending on device conductivity type, improved depletion can be achieved. The sidewall contact is possible for logic gates that have transistor channel regions with non-gated sidewall portions or partially surrounded channel regions. Due to the partially surrounding gate structure presented herein, a channel contact may be made and depletion will be improved.

In addition, referring back to FIG. 25 and 26, interconnects 118 and 120 are output nodes for the SRAM cell (i.e. analogous to or coupled to the output nodes 101 and 103 if FIG. 22). It is known in the art that a biased capacitor placed adjacent the output nodes of an SRAM improves a known and understood soft error immunity. Therefore, a diffusion (not illustrated) may be formed underneath the interconnects 118 and 120 in FIGS. 25 and 26. This diffusion (not illustrated) may be connected to the diffusion 14 and therefore connected to ground in a preferred form, or may be connected to another conventional potential. The diffusion (not illustrated) will add capacitive coupling to the interconnects 118 and 120 and improve soft error immunity.

While the present invention has been illustrated and described with reference to specific embodiments, further modifications and improvements will occur to those skilled in the art. For example, the SRAM memory taught herein may be inverted wherein the Vdd supply voltage is a diffusion region and Vss supply voltage is formed in metal. P-channel and N-channel transistors may be stacked on top of one another to form other SRAM embodiments. Polysilicon vertical TFTs may be used as resistive devices. Other vertical transistors exist in the prior art and any vertical transistor may be used to form an SRAM cell which is similar to the SRAM cell taught herein. Various techniques for sidewall dielectric formation exist and various spacer techniques can be used in conjunction with the present invention. Various methods of silicidation exist. Many of the features of the inventive device can be optionally self-aligned or not self-aligned.

Furthermore, many device structures are possible, such as no LDD, half LDD, full LDD, double LDD, and in-situ graded LDD electrode structures. Nitrided gate oxides are used to reduce RIE (reactive ion etch) damage to sidewall gate dielectrics. Various process integration schemes are possible due to the wide range of layouts and process flows. Other vertical layouts exist. It should be apparent that the methods and devices taught herein can be used to form other conventional SRAM-like memory cells. In some cases, the resistive devices presented herein may not need to be large. The vertical transistors in the inventive SRAM cell have current electrodes which are isolated from the substrate. This isolation allows the electrodes to function as capacitors. Therefore, the inventive cell may operate as a cross between a dynamic random access memory (DRAM) and an SRAM cell. Furthermore, other SRAM circuits may be made by using the methods and devices taught herein. For example, an N channel transistor may be formed underlying a P-channel TFT or an N-channel transistor may be formed underlying a resistor. It is to be understood, therefore, that this invention is not limited to the particular forms illustrated and that it is intended in the appended claims to cover all modifications that do not depart from the spirit and scope of this invention.

We claim:

1. A semiconductor memory device comprising:
   a substrate having a surface;
   a first transistor at least partially overlying the surface of the substrate, the first transistor having a first current electrode, a second current electrode overlying the first current electrode, a channel region between the first and second current electrodes, and at least one gate electrode adjacent the channel region;
   a second transistor overlying the first transistor, the second transistor having a first current electrode, a second current electrode overlying the first current electrode, a channel region between the first and second current electrodes, and at least one gate electrode adjacent the channel region; and
   electrical interconnects coupled to both the first transistor and the second transistor to connect the first and second transistors in series between a first node and a second node of said semiconductor memory device.

2. The semiconductor memory device of claim 1 further comprising:
   a third transistor formed at least partially overlying the surface of the substrate, the third transistor having a first current electrode, a second current electrode overlying the first current electrode, a channel region between the first and second current electrodes, and at least one gate electrode adjacent the channel region;
   a fourth transistor overlying the third transistor, the fourth transistor having a first current electrode, a second current electrode overlying the first current electrode, a channel region between the first and second current electrodes, and at least one gate electrode adjacent the channel region; and
   electrical interconnect material coupling the third transistor and the fourth transistor to one of either the first transistor or the second transistor.

3. The semiconductor memory device of claim 2 wherein the third and fourth transistors are both formed as N-channel transistors.

4. The semiconductor memory device of claim 1 wherein both the first and second transistors are formed as N-channel transistors.

5. The semiconductor memory device of claim 1 wherein the substrate further comprises:
   a diffusion region within the substrate, the diffusion region underlying the first transistor.

6. The semiconductor memory device of claim 5 wherein the diffusion region further comprises:
   a silicided region adjacent the diffusion region.

7. The semiconductor memory device of claim 1 wherein the first transistor is coupled to a resistive device via a conductive interconnection.

8. The semiconductor memory device of claim 7 wherein the resistive device is a resistor.

9. The semiconductor memory device of claim 7 wherein the resistive device is a P-channel transistor.

10. The semiconductor memory device of claim 7 wherein a capacitive element is adjacent said conductive interconnection.

11. The semiconductor memory device of claim 7 wherein the conductive interconnection directly underlies said resistive device.

12. The semiconductor memory device of claim 1 wherein one of either the first transistor or the second transistor has a composite gate dielectric having a first region made of a first dielectric material and a second region made of a second dielectric material.

13. A semiconductor memory device comprising:
   a substrate having a surface;
   a first vertical structure at least partially overlying the surface of the substrate, the first vertical structure having a first vertical transistor underlying a first semiconductor device;
   a second vertical structure at least partially overlying the surface of the substrate and laterally adjacent the first vertical structure, the second vertical structure having a second vertical transistor underlying a second semiconductor device; and
   electrical interconnects used to: (1) couple the first vertical transistor in series with the first semiconductor device; (2) couple the second vertical transistor in series with the second semiconductor device; and (3) couple the first vertical structure to the second vertical structure.

14. The semiconductor memory device of claim 13 wherein the first and second semiconductor devices are respectively third and fourth vertical transistors.

15. The semiconductor memory device of claim 13 wherein the first and second vertical transistors each have a first current electrode, a second current electrode overlying the first current electrode, a channel region between the first and second current electrodes, and at least one gate electrode adjacent the channel region.

16. The semiconductor memory device of claim 13 wherein both the first and second transistors are formed as N-channel transistors.

17. The semiconductor memory device of claim 13 wherein the substrate further comprises:
   a diffusion region within the substrate, the diffusion region underlying the first transistor.

18. The semiconductor memory device of claim 13 wherein the diffusion region further comprises:
   a silicided region adjacent the diffusion region.

19. The semiconductor memory device of claim 13 wherein the first transistor is coupled to a resistive device via a conductive interconnection.

20. The semiconductor memory device of claim 19 wherein the resistive device is a resistor.

21. The semiconductor memory device of claim 19 wherein the resistive device is a P-channel transistor.

22. The semiconductor memory device of claim 19 wherein a capacitive element is adjacent said conductive interconnection.

23. The semiconductor memory device of claim 19 wherein the conductive interconnection directly underlies said resistive device.

24. The semiconductor memory device of claim 13 wherein one of either the first transistor or the second transistor has a composite gate dielectric having a first region made of a first dielectric material and a second region made of a second dielectric material.

25. A semiconductor random access memory device comprising:
   a substrate;
   a first vertical transistor formed overlying the substrate, the first vertical transistor having a first current electrode underlying a second current electrode wherein a channel region separates the first and second current electrodes, a gate dielectric region is positioned laterally adjacent the channel region and a gate electrode is positioned laterally adjacent the gate dielectric region opposite the channel region, the first current electrode of the first transistor being coupled to a ground potential;
   a second vertical transistor formed overlying the first vertical transistor, the first vertical transistor having a first current electrode underlying a second current electrode wherein a channel region separates the first and second current electrodes, a gate dielectric region is positioned laterally adjacent the channel region and a gate electrode is positioned laterally adjacent the gate dielectric region opposite the channel region, the first current electrode of the second transistor being connected with the second current electrode of the first transistor to form a first storage node, the gate electrode of the second vertical transistor being a word line, the second current electrode-of the second transistor being coupled to a bit line; and
   a first resistive device coupled between the first storage node and a power supply conductor.

26. The semiconductor random access memory device of claim 25 further comprising:
   a third vertical transistor formed overlying the substrate and laterally separated from the first transistor, the third vertical transistor having a first current electrode underlying a second current electrode wherein a channel region separates the first and second current electrodes, a gate dielectric region is positioned laterally adjacent the channel region and a gate electrode is positioned laterally adjacent the gate dielectric region opposite the channel region, the first current electrode of the third transistor being coupled to a ground potential;
   a fourth vertical transistor formed overlying the third vertical transistor, the fourth vertical transistor having a first current electrode underlying a second current electrode wherein a channel region separates the first and second current electrodes, a gate dielectric region is positioned laterally adjacent the channel region and a gate electrode is positioned laterally adjacent the gate dielectric region opposite the channel region, the first current electrode of the fourth transistor being connected with the second current electrode of the third transistor to form a second storage node, the gate electrode of the fourth vertical transistor being another word line, the second current electrode of the fourth transistor being coupled to a complement bit line;
   a second resistive device being between the second storage node and a power supply conductor;
   a first conductive interconnect coupling the gate electrode of the first transistor to the second storage node; and
   a second conductive interconnect coupling the gate electrode of the third transistor to the second storage node.

27. The semiconductor random access memory device of claim 25 wherein the first resistive device is a device selected from a group consisting of: a resistor, a polysilicon resistor, an amorphous silicon resistor, a P-channel transistor, a P-channel thin film transistor, a P-channel vertical transistor.

28. A memory device comprising:
   a substrate;

a first vertical device having a first current electrode coupled to a first voltage potential and a second current electrode overlying the first current electrode;

a second vertical device overlying the first vertical device and having a first current electrode coupled to the second current electrode of the first vertical device and a second current electrode overlying the first current electrode, the second current electrode of the second vertical device being coupled to a first conductive interconnect layer;

a third vertical device coupled between the second current electrode of the first vertical device and a second conductive interconnect layer;

a fourth vertical device laterally separated from the first vertical device having a first current electrode coupled to the first voltage potential and a second current electrode overlying the first current electrode;

a fifth vertical device overlying the fourth vertical device and having a first current electrode coupled to the second current electrode of the fourth vertical device and a second current electrode overlying the first current electrode, the second current electrode being coupled to a third conductive interconnect layer; and a sixth vertical device coupled between the second current electrode of the fourth vertical device and a fourth conductive interconnect layer.

29. A semiconductor memory device comprising:
a substrate having a surface;
a first vertical structure at least partially overlying the surface of the substrate, the first vertical structure having a first vertical transistor overlying a first semiconductor device;
a second vertical structure at least partially overlying the surface of the substrate and laterally adjacent the first vertical structure, the second vertical structure having a second vertical transistor overlying a second semiconductor device; and
electrical interconnects used to: (1) couple the first vertical transistor in series with the first semiconductor device; (2) couple the second vertical transistor in series with the second semiconductor device; and (3) couple the first semiconductor device to the second semiconductor device.

30. A static random access memory cell comprising:
a vertical transistor having a first current electrode, a second current electrode overlying the first current electrode, a channel region seperating the first current electrode from the second current electrode, and a gate electrode for selectively changing a conducitivty in the channel region, the gate electode being coupled to a current electrode of another device within the static random access memory cell;
a vertical resistive device formed overlying the first vertical transistor, the vertical resistive device having a first end coupled to a power supply conductor and a second end coupled to the second current electrode of the vertical transistor; and
an output conductor coupled to the second current electrode of the vertical transistor wherein the output conductor couples the second current electrode of the vertical transistor to a gate electrode of said another device within the static random access memory cell.

31. A static random access memory cell comprising:
a vertical transistor having a first current electrode, a second current electrode overlying the first current electrode, a channel region seperating the first current electrode from the second current electrode, and a gate electrode for selectively changing a conducitivty in the channel region, the gate electode being coupled to a current electrode of another device within the static random access memory cell;
a vertical resistive device formed underlying the first vertical transistor, the vertical resistive device having a first end coupled to a power supply conductor and a second end coupled to the first current electrode of the vertical transistor; and
an output conductor coupled to the first current electrode of the vertical transistor wherein the output conductor couples the first current electrode of the vertical transistor to a gate electrode of said another device within the static random access memory cell.

* * * * *